United States Patent
Ohta et al.

(10) Patent No.: US 6,833,771 B1
(45) Date of Patent: Dec. 21, 2004

(54) HIGH EFFICIENCY AMPLIFIER WITH AMPLIFIER ELEMENT, RADIO TRANSMISSION DEVICE THEREWITH AND MEASURING DEVICE THEREFOR

(75) Inventors: Akira Ohta, Hyogo (JP); Akira Inoue, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 237 days.

(21) Appl. No.: 09/717,215

(22) Filed: Nov. 22, 2000

(30) Foreign Application Priority Data

May 16, 2000 (JP) .................................... 2000-143441

(51) Int. Cl.[7] .............................................. H03H 7/38
(52) U.S. Cl. ........................................ 333/33; 333/1.1
(58) Field of Search ....................... 333/33, 1.1, 24.2

(56) References Cited

U.S. PATENT DOCUMENTS

| | | | |
|---|---|---|---|
| 5,473,281 A | * 12/1995 | Honjo | .......................... 330/286 |
| 5,945,887 A | 8/1999 | Makino et al. | |
| 6,020,793 A | * 2/2000 | Makino et al. | ............... 333/1.1 |
| 6,215,987 B1 | 4/2001 | Fujita | .......................... 455/127 |

FOREIGN PATENT DOCUMENTS

| | | |
|---|---|---|
| JP | 4-107903 | 9/1992 |
| JP | 7-9258 | 1/1995 |
| JP | 10-150334 | 6/1998 |
| JP | 10-327003 | 12/1998 |
| KR | 0136216 | 1/1998 |
| KR | 1998-042552 | 8/1998 |
| KR | 1999-006729 | 1/1999 |
| KR | 10-0203056 | 3/1999 |

\* cited by examiner

Primary Examiner—Robert Pascal
Assistant Examiner—Joseph Chang
(74) Attorney, Agent, or Firm—McDermott, Will & Emery

(57) ABSTRACT

A low impedance high efficiency amplifier is connected to a low impedance isolator. The low impedance high efficiency amplifier includes a plurality of amplifiers and an output matching circuit having a harmonic processing circuit arranged between a fundamental wave regulator circuit/a final stage amplifier and the low impedance isolator.

26 Claims, 20 Drawing Sheets

HIGH EFFICIENCY AMPLIFIER WITH AMPLIFIER ELEMENT, RADIO TRANSMISSION DEVICE THEREWITH AND MEASURING DEVICE THEREFOR

BACKGROUND OF THE INVENTION

1. Field of the Invention

The present invention relates to high efficiency amplifiers, radio transmission devices and measuring devices for high efficiency amplifiers, and more particularly to high efficiency amplifiers used particularly in mobile communication apparatus, microwave band communication apparatus or the like, constituted of semiconductor amplifiers for amplification in devices, such as, FET's (Field Effect Transistors), transistors or the like, and, to radio transmission devices with the high efficiency amplifiers and measuring devices for the high efficiency amplifiers.

2. Description of the Background Art

With reference to FIG. 35, a conventional radio transmission unit (first example of a conventional art) used in portable remote terminals will be described. In FIG. 35, a radio transmission unit 9100 includes a high efficiency amplifier 101, non-reciprocal circuit element 103, and a transmission line 102 connecting high efficiency amplifier 101 and non-reciprocal circuit element 103.

High efficiency amplifier 101 includes an input matching circuit 104, a first-stage amplifier 105, an interstage matching circuit 106, a second-stage amplifier 107 and an output matching circuit 108. Between an input terminal and an output terminal of high efficiency amplifier 101, input matching circuit 104, first-stage amplifier 105, interstage matching circuit 106, second-stage amplifier 107 and output matching circuit 108 are connected in this order.

Output matching circuit 108 includes a harmonic processing circuit 111 and a fundamental wave matching circuit 112. Harmonic processing circuit 111 is a circuit for processing a harmonic and performs an operation such as impedance matching of a harmonic. Fundamental wave matching circuit 112 performs impedance matching of a fundamental wave.

In mobile communication apparatus or the like, a non-reciprocal circuit element is employed in an isolator or the like for achieving a highly efficient operation of an amplifier regardless of the condition of an antenna. Hereinbelow, as an example of the non-reciprocal circuit element, an isolator will be described. An isolator 103 includes an input matching circuit 109 connected to transmission line 102 and an isolator body 110 connected between input matching circuit 109 and an output terminal.

The output impedance of high efficiency amplifier 101 and input/output impedance of isolator 103 are 50Ω, because a high-frequency measuring device conventionally used for the evaluation of high-frequency apparatus is formed to have 50Ω (hereinafter the letter Ω represents ohm) termination. On the other hand, the output impedance of second-stage amplifier 107 is 1~10Ω. Therefore, fundamental wave matching circuit 112 is formed as a converter circuit to convert the output impedance of second-stage amplifier 107 (1~10Ω) to 50Ω.

A signal input from the input terminal is amplified by high efficiency amplifier 101. The amplified signal is output via transmission line 102 and isolator 103. Reflected waves generated after the signal passed isolator 103 is blocked by isolator 103. Therefore, the reflected wave does not go back to high efficiency amplifier 101 and highly efficient stable operation of high efficiency amplifier 101 is allowed.

In recent years, portable remote terminals are becoming smaller and lighter, and the reduction in size and weight are now key factors in the development. What contributes most to this purpose is reduction in size of battery. In order to realize smaller battery while enabling a certain length of conversation, implementation of a high efficiency amplifier is important because the amplifier consumes a large part of power consumed in the device.

In the structure of radio transmission unit 9100 as described above, however, loss in fundamental wave matching circuit 112 is large and it is difficult to realize a highly efficient amplifier.

One way to improve the efficiency is to establish the relation, 2Ω<Z<12.5Ω, between the output impedance of the high efficiency amplifier, the input impedance of the non-reciprocal circuit element (isolator) and impedance Z of the line connecting the high efficiency amplifier and the non-reciprocal circuit element, as described in "Non-reciprocal Circuit Element and Composite Electronic Component (Japanese Patent Laying-Open No. 10-327003)".

An example of the radio transmission unit (second example of a conventional art) employing a low impedance isolator as described in the above cited document will be described with reference to FIG. 36. A radio transmission unit 9200 shown in FIG. 36 is constituted of a low impedance high efficiency amplifier 113, a low impedance transmission line 114 and a low impedance isolator 115. The output impedance of low impedance high efficiency amplifier 113 is lower than 50Ω, the input impedance of low impedance isolator 115 is lower than 50Ω and the output impedance of low impedance isolator 115 is 50Ω).

High efficiency amplifier 113 is constituted of an input matching circuit 104, a first-stage amplifier 105, an interstage matching circuit 106 and a second-stage amplifier 107.

Isolator 115 includes an isolator body 110 and a low impedance input matching circuit 116 performing impedance matching between isolator body 110 and transmission line 114.

In the second example of a conventional art, the output impedance of high efficiency amplifier 113 is 1Ω~10Ω (the output impedance of second-stage amplifier 107.) Input matching circuit 116 in isolator 115 adjusts the input impedance of the low impedance isolator to match with the output impedance of high efficiency amplifier 113.

Compared with the first example of a conventional art, the second example does not include the output matching circuit in the high efficiency amplifier. Hence, the loss generated in output matching circuit 108 is eliminated and the current consumption in the structure as a whole including the high efficiency amplifier and the isolator is reduced. The second example of a conventional art, however, has the following problems.

First, fundamental wave matching circuit 112 in the first example is constituted of a combination of a series inductance, a parallel capacitor and so on and serves as a reject filter for a harmonic such as a second harmonic and a third harmonic. On the other hand, in the second example, leakage power associated with harmonic increases, because the second example does not include fundamental wave matching circuit 112.

To solve this problem, addition of a high harmonics reject filter circuit is effective. The filter circuit can be added in a low impedance line or in a high impedance line. The effect of harmonic rejection is more significant when the filter circuit is added to the high impedance circuit, in which the impedance of harmonic of the filter circuit appears to be relatively low. Therefore, in the second example of a conventional art, a filter circuit 117 may be added to the output side (where impedance is connected to the 50Ω transmission line) of isolator 115 as shown in FIG. 36.

When the leakage power associated with the harmonics is suppressed by the addition of the filter circuit, however, the current consumption of the high efficiency amplifier is increased because of the loss generated in the filter circuit.

In addition, as a conventional measuring device for evaluating these circuits is designed based on the standard value of 50Ω, the measurement of the circuit with different impedance is difficult.

SUMMARY OF THE INVENTION

Hence, the present invention is made to solve the above described problems and its object is to provide high efficiency amplifiers with low current consumption and high efficiency and radio transmission devices, and measuring devices for evaluating the high efficiency amplifiers.

In one aspect of the present invention, a high efficiency amplifier is connected to a non-reciprocal circuit element, having an input impedance lower than a standard impedance and an output impedance substantially equal to the standard impedance, the high efficiency amplifier includes: an input terminal to receive an input signal; an output terminal connected to the non-reciprocal circuit element; an amplifier element to amplify the input signal; and one or a plurality of harmonic processing circuits arranged between the amplifier element and the output terminal to process a harmonic in an output signal of the amplifier element.

Preferably, the standard impedance is 50 ohm and an output impedance at the output terminal is substantially in the range from 3 ohm to 30 ohm.

More preferably, at least one of one or the plurality of harmonic processing circuits is constituted of a circuit to match impedance of the harmonic, a circuit to suppress harmonic-related power leakage caused by the harmonic, a circuit to serve as an open circuit load to the harmonic, a circuit to serve as a short circuit load to the harmonic, or the like.

Preferably, resonance frequency of the plurality of harmonic processing circuits are different from each other.

Preferably, the high efficiency amplifier further includes a fundamental wave regulator circuit between the amplifier element and the output terminal to perform a fine adjustment of an impedance of a fundamental wave in an output signal of the amplifier element.

Particularly, the harmonic processing circuit is constituted of a capacitance element and a parasitic inductor coupled to the capacitance element. The capacitance element is a chip capacitor. The parasitic inductor is a microstrip line.

Preferably, the high efficiency amplifier further includes a coupled circuit arranged between the amplifier element and the output terminal, and the coupled circuit includes a first output terminal to output power of an amount corresponding to an input power to the output terminal side, and a second output terminal to output power of an amount corresponding to a predetermined ratio of power output from the first output terminal.

Preferably, the high efficiency amplifier further includes an output matching circuit having one or the plurality of harmonic processing circuits, to match an impedance of an output signal of the amplifier element. The output matching circuit is constituted only of a signal line to transmit a signal, a bias circuit to supply a bias voltage to the amplifier element, and one or a plurality of elements connected in parallel to the signal line and having one or the plurality of harmonic processing circuits. Alternatively, the output matching circuit is constituted only of a signal line to transmit a signal, a bias circuit to supply a bias voltage to the amplifier element, one or a plurality of first elements connected in parallel to the signal line and including one or the plurality of harmonic processing circuits, and one or a plurality of second elements other than a capacitance, the second elements being connected in series with the signal line.

Thus, in the high efficiency amplifier as described above, with the addition of the harmonic processing circuit between the amplifier element and the output terminal, the reduction in harmonic related leakage power and improvement in efficiency can be realized. In addition, as the low impedance non-reciprocal circuit element is connected, the fundamental wave matching circuit is not necessary and the current consumption can be reduced.

Particularly, when a plurality of harmonic processing circuits are provided, rejection effect of harmonic related leakage power can be improved. In particular, the effect of rejection of harmonics related leakage power can be further improved by arranging the plurality of harmonic processing circuits such that resonance frequency is different from circuit to circuit.

In addition, the fine adjustment of impedance can be achieved with low current consumption because the fundamental wave regulator circuit is provided.

In addition, the harmonic processing circuit can be constituted of a capacitance element and a parasitic inductor coupled with the capacitance element.

Further, the coupled circuit is arranged between the amplifier element and the output terminal. Thus, the operation in the low impedance high efficiency amplifier can be measured.

In another aspect of the present invention, a high efficiency amplifier includes: an input terminal to receive an input signal; an output terminal to output a signal; an amplifier element to amplify the input signal; and an output matching circuit to match an impedance of an output signal from the amplifier element, and the output matching circuit is constituted only of a signal line to transmit a signal, a bias circuit to supply a bias voltage to the amplifier element and one or a plurality of elements connected in parallel with the signal line.

Preferably, one or the plurality of elements are arranged between the amplifier element and the output terminal and include a harmonic processing circuit to process a harmonic in an output signal of the amplifier element.

In another aspect of the present invention, a high efficiency amplifier includes: an input terminal to receive an input signal; an output terminal to output a signal; an amplifier element to amplify the input signal; and an output matching circuit to match an impedance of an output signal of the amplifier element, and the output matching circuit is constituted only of a signal line to transmit a signal, a bias circuit to supply a bias voltage to the amplifier element, one or a plurality of first elements connected in parallel with the signal line, and one or a plurality of second elements other than a capacitance, the second elements being connected in series with the signal line.

Preferably, one or the plurality of first elements are arranged between the amplifier element and the output terminal and include a harmonic processing circuit to process a harmonic in an output signal of the amplifier element.

Thus, in the high efficiency amplifier as described above, the capacitance elements in the output matching circuit are arranged such that the capacitance elements are not connected in series. Thus the loss caused by the series resistance of series capacitor in the output matching circuit can be reduced.

In still another aspect of the present invention, the high efficiency amplifier includes: an input terminal to receive an input signal; an output terminal to output a signal; an amplifier element to amplify the input signal; and an output matching circuit to match an impedance of an output signal from the amplifier element; the output matching circuit includes a plurality of capacitance elements to cut a direct current bias component in the input signal, and the plurality of capacitance elements are arranged in parallel between the input terminal and the output terminal Each of the plurality of capacitance elements is a chip capacitor.

In the high efficiency amplifier according to the present invention, the plurality of capacitance elements are arranged in parallel to cut the direct current bias component in the output matching circuit. Thus the loss caused by the series resistance of series capacitor can be reduced.

According to still another aspect of the present invention, a high efficiency amplifier is arranged between a first transmission line of a standard impedance and a second transmission line of an impedance lower than the standard impedance, and the high efficiency amplifier includes: an input terminal to receive an input signal from the first transmission line; an output terminal connected to the second transmission line; an amplifier element to amplify the input signal; and a low impedance line portion formed in a signal path between the input terminal and the output terminal and having an adjustable impedance.

Preferably, the high efficiency amplifier further includes, a harmonic processing circuit arranged between the amplifier element and the output terminal to process a harmonic in an output signal of the amplifier element, wherein the standard impedance is 50 ohm, and an output impedance in the output terminal is substantially in the range from 3 ohm to 30 ohm.

Particularly, the low impedance line portion includes a low impedance transmission line to transmit a signal formed to have a portion separable from the signal path. Alternatively, the low impedance line portion includes a low impedance transmission line to transmit a signal, and a pad connectable to the low impedance transmission line and arranged at a predetermined distance from the low impedance transmission line.

Thus in the high efficiency amplifier as described above, the low impedance high efficiency amplifier includes the low impedance line portion of which line the impedance can be adjusted. Thus, without the fundamental wave matching circuit, the impedance for the fundamental waves can be readily matched.

According to still further aspect of the present invention, a high efficiency amplifier is connected between a first transmission line of a standard impedance and a second transmission line of an impedance lower than the standard impedance, the high efficiency amplifier includes: a substrate; an input terminal to receive an input signal from the first transmission line; an output terminal connected to the second transmission line; an amplifier element formed on the substrate to amplify the input signal and a low impedance line portion formed on the substrate and in a signal path between the input terminal and the output terminal, and the low impedance line portion is formed from a low impedance transmission line to transmit a signal and a high-dielectric constant substrate with a different dielectric constant from the substrate.

Preferably, the high efficiency amplifier further includes a harmonic processing circuit arranged between the amplifier element and the output terminal to process a harmonic in an output signal of the amplifier element, wherein the standard impedance is 50 ohm and an output impedance at the output terminal is substantially in the range from 3 ohm to 30 ohm. In particular, the high-dielectric constant substrate is formed on or in the substrate.

Thus in the high efficiency amplifier as described above, the high-dielectric constant substrate other than the substrate is provided in the signal path in the low impedance high efficiency amplifier. Then, the line width of the low impedance transmission line can be reduced. Thus, the high efficiency amplifier can be reduced in size.

According to still another aspect of the present invention, a high efficiency amplifier is connected between a first transmission line of a first impedance and a second transmission line of a second impedance different from the first impedance, the high efficiency amplifier includes: an input terminal to receive an input signal from the first transmission line; an output terminal connected to the second transmission line; an amplifier element arranged between the input terminal and the output terminal to amplify the input signal; and a low impedance transmission line arranged between the input terminal and the output terminal to transmit a signal, and the low impedance transmission line is formed at a distance away from a ground potential, the distance between the low impedance transmission line and the ground potential is different from a distance between the first transmission line and the ground potential.

Preferably, the second impedance is lower than the first impedance, and the distance between the low impedance transmission line and the ground potential is shorter than the distance between the first transmission line and the ground potential.

In the high efficiency amplifier according to the present invention, the interval between the low impedance transmission line and the GND line is made narrower than the interval between the line of 50Ω, which is the standard impedance, and the GND line. Then, the line width of the low impedance transmission line can be made smaller. Thus, the high efficiency amplifier can be reduced in size.

According to still further aspect of the present invention, a high efficiency amplifier is connected between a first transmission line of a first impedance and a second transmission line of a second impedance different from the first impedance, the high efficiency amplifier includes: an input terminal to receive an input signal from the first transmission line; an output terminal connected to the second transmission line; and an amplifier element arranged between the input terminal and the output terminal to amplify the input signal, and the input terminal and the output terminal are different in size according to impedance of a connected transmission line.

Preferably, the second impedance is lower than the first impedance and a size of the output terminal is larger than a size of the input terminal.

Thus, in the high efficiency amplifier as described above, the input terminal and the output terminal are formed in different size from each other. Thus, the input terminal and the output terminal can be readily coupled with the transmission lines with different amount of impedance, respectively.

According to still another aspect of the invention, a radio transmission device includes: a high efficiency amplifier having an output impedance lower than a standard impedance; a non-reciprocal circuit element having an input impedance lower than the standard impedance and an output impedance substantially equal to the standard impedance and a transmission line to connect the high efficiency amplifier and the non-reciprocal circuit element; wherein the high efficiency amplifier includes an input terminal to receive an input signal, an output terminal connected to the non-reciprocal circuit element via the transmission line, an amplifier element to amplify the input signal, and one or a plurality of harmonic processing circuits arranged between the amplifier element and the output terminal to process a harmonic in an output signal of the amplifier element.

Preferably, the standard impedance is 50 ohm and an output impedance in the high efficiency amplifier is substantially in the range from 3 ohm to 30 ohm.

More preferably, at least one of one or the plurality of harmonic processing circuits in the radio transmission device is a circuit to match impedance of the harmonic, a circuit to suppress harmonic-related power leakage caused by the harmonic, a circuit to serve as an open circuit load to the harmonic, a circuit to serve as a short circuit load to the harmonic or the like.

In particular, resonance frequency of the plurality of harmonic processing circuits in the radio transmission device are different from each other.

Preferably, the high efficiency amplifier in the radio transmission device further includes, a fundamental wave regulator circuit between the amplifier element and the output terminal to perform a fine adjustment of an impedance of a fundamental wave in an output signal of the amplifier element.

Preferably, the harmonic processing circuit in the radio transmission device is constituted of a capacitance element and a parasitic inductor coupled to the capacitance element. Further, the capacitance element is a chip capacitor. The parasitic inductor is a microstrip line.

Preferably, the high efficiency amplifier further includes, a coupled circuit, arranged between the amplifier element and the output terminal, including a first output terminal to output power of an amount corresponding to an input power to the output terminal side, and a second output terminal to output power of an amount corresponding to a predetermined ratio of power output from the first output terminal.

The radio transmission device as described above includes the low impedance high efficiency amplifier and the low impedance non-reciprocal circuit element, and the harmonic processing circuit is arranged between the high efficiency amplifier and the low impedance non-reciprocal circuit element. Thus, the reduction in harmonic-related leakage power and the improvement in efficiency can be realized. In addition, as the low impedance non-reciprocal circuit element is connected, the arrangement of the fundamental wave matching circuit in the low impedance high efficiency amplifier is not necessary, and the reduction in current consumption is allowed.

Particularly, because of the arrangement of the plurality of harmonics processing circuits, the effect of rejection of harmonic-related leakage power can be improved. In particular, the effect of rejection of harmonic-related leakage power can be further improved when the plurality of harmonic processing circuits are arranged such that the resonance frequency becomes different from circuit to circuit.

In addition, by providing the fundamental wave regulator circuit on the side of the low impedance high efficiency amplifier, a fine adjustment of impedance can be performed at a low current consumption.

Further, the harmonic processing circuit can be constituted of the capacitance element and the parasitic inductor coupled with the capacitance element.

Still further, the coupled circuit is arranged between the amplifier element and the output terminal of the low impedance high efficiency amplifier. Then, measurement can be performed on the operation in the low impedance high efficiency amplifier.

According to still further aspect of the present invention, a radio transmission device includes: a high efficiency amplifier; a non-reciprocal circuit element; and a transmission line to connect the high efficiency amplifier and the non-reciprocal circuit element; wherein the high efficiency amplifier includes, an input terminal to receive an input signal, an output terminal connected to the non-reciprocal circuit element via the transmission line, an amplifier element to amplify the input signal, and an output matching circuit connected to the output terminal to match an impedance of an output signal of the amplifier element. The output matching circuit is constituted only of a signal line to transmit a signal, a bias circuit to supply a bias voltage to the amplifier element, and one or a plurality of elements connected in parallel with the signal line, and the non-reciprocal circuit element includes an input matching circuit to match an impedance of an input signal, and a capacitance element to cut a direct current bias component in the input signal is included only in the input matching circuit.

Preferably, an output impedance in the high efficiency amplifier in the radio transmission device is substantially in the range from 3 ohm to 30 ohm.

Preferably, one or the plurality of elements are arranged between the amplifier element and the output terminal and include a harmonic processing circuit to process a harmonic in an output signal of the amplifier element, and the harmonic processing circuit includes a capacitance element and an inductor arranged in series between the signal line and a ground potential.

According to still further aspect of the present invention, a radio transmission device includes: a high efficiency amplifier; a non-reciprocal circuit element; and a transmission line to connect the high efficiency amplifier and the non-reciprocal circuit element; wherein the high efficiency amplifier includes an input terminal to receive an input signal, an output terminal connected to the non-reciprocal circuit element via the transmission line, an amplifier element to amplify the input signal, and an output matching circuit connected to the output terminal to match an impedance of an output signal of the amplifier element. The output matching circuit is constituted only of a signal line to transmit a signal, a bias circuit to supply a bias voltage to the amplifier element, one or a plurality of first elements connected in parallel with the signal line, and one or a plurality of second elements other than a capacitance, connected in series with the signal line, and the non-reciprocal circuit element includes an input matching circuit to match an impedance of an input signal, and a capacitance element to cut a direct current bias component in the input signal is included only in the input matching circuit.

Preferably, an output impedance in the high efficiency amplifier in the radio transmission device is substantially in the range from 3 ohm to 30 ohm.

Preferably, one or the plurality of first elements are arranged between the amplifier element and the output terminal and include a harmonic processing circuit to process a harmonic in an output signal of the amplifier element, and the harmonic processing circuit is constituted of a capacitance element and an inductor arranged in series between the signal line and a ground potential.

Thus, in the radio transmission device as described above, the capacitance elements in the output matching circuit included in the high efficiency amplifier are arranged such that they are not connected in series. Thus, the loss caused by the series resistance of series capacitor can be reduced. On the other hand, the capacitance element is provided for cutting off the direct current bias component in the input matching circuit in the non-reciprocal circuit element. Thus, the direct current bias component can be cut off.

According to still further aspect of the present invention, a radio transmission device includes: a high efficiency amplifier; a non-reciprocal circuit element; and a transmission line to connect the high efficiency amplifier and the non-reciprocal circuit element; wherein the high efficiency amplifier includes an input terminal to receive an input signal, an output terminal connected to the non-reciprocal circuit element via the transmission line, an amplifier element to amplify the input signal, and an output matching circuit connected to the output terminal to match an impedance of a signal output from the amplifier element, and the output matching circuit includes a plurality of capacitance elements arranged in parallel between the input terminal and the output terminal to cut a direct current bias component in the input signal.

Preferably, an output impedance in the high efficiency amplifier in the radio transmission device is substantially in the range from 3 ohm to 30 ohm. In particular, each of the plurality of capacitance elements is a chip capacitor.

Thus, in the radio transmission device as described above, the plurality of capacitance elements are arranged in parallel for cutting off the direct current bias component in the output matching circuit in the high efficiency amplifier. Thus, the loss caused by the series resistance of series capacitor can be reduced.

According to still further aspect of the present invention, a radio transmission device, includes: a high efficiency amplifier having an output impedance lower than a standard impedance; a non-reciprocal circuit element having an input impedance lower than the standard impedance and an output impedance substantially equal to the standard impedance; and a transmission line to connect the high efficiency amplifier and the non-reciprocal circuit element; wherein the high efficiency amplifier includes an input terminal to receive an input signal, an output terminal connected to the non-reciprocal circuit element via the transmission line, an amplifier element to amplify the input signal, and a low impedance line portion formed in a signal path between the input terminal and the output terminal having an adjustable impedance.

Preferably, the high efficiency amplifier further includes a harmonic processing circuit arranged between the amplifier element and the output terminal to process a harmonic in an output signal of the amplifier element, and wherein the standard impedance is 50 ohm and an output impedance in the high efficiency amplifier is substantially in the range from 3 ohm to 30 ohm.

More preferably, the low impedance line portion includes a low impedance transmission line to transmit a signal, formed to have a portion separable from the signal path. Alternatively, the low impedance line portion includes a low impedance transmission line to transmit a signal and a pad arranged at a predetermined distance away from the low impedance transmission line and connectable with the low impedance transmission line.

Thus, the radio transmission device as described above includes the low impedance high efficiency amplifier, the low impedance non-reciprocal circuit element and the low impedance line portion of which the impedance can be adjusted. Thus, without the fundamental wave matching circuit in the low impedance high efficiency amplifier, the impedance for the fundamental wave can be readily matched.

According to still further aspect of the present invention, a radio transmission device includes: a substrate; a high efficiency amplifier having an output impedance lower than a standard impedance; a non-reciprocal circuit element having an input impedance lower than the standard impedance and an output impedance substantially equal to the standard impedance; and a low impedance line portion formed in a signal path between the high efficiency amplifier and the non-reciprocal circuit element formed on the substrate; wherein the low impedance line portion is formed from a low impedance transmission line to transmit a signal and a high-dielectric constant substrate with a dielectric constant different from the substrate.

Preferably, the high efficiency amplifier includes, an input terminal to receive an input signal, an amplifier element to amplify the input signal, an output terminal, and a harmonic processing circuit arranged between the amplifier element and the output terminal to process a harmonic in an output signal of the amplifier element, wherein the standard impedance is 50 ohm and an output impedance in the high efficiency amplifier is substantially in the range from 3 ohm to 30 ohm. Particularly, the high-dielectric constant substrate is formed on or in the substrate.

Thus, the radio transmission device as described above includes the low impedance high efficiency amplifier and the low impedance non-reciprocal circuit element and the high-dielectric constant substrate is provided in the low impedance transmission line besides the radio transmission unit substrate. Thus, the line width of the low impedance transmission line can be reduced. As a result, the radio transmission device can be reduced in size.

According to still further aspect of the present invention, a radio transmission device includes: a substrate; a high efficiency amplifier having an output impedance lower than the standard impedance; a non-reciprocal circuit element having an input impedance lower than the standard impedance and an output impedance substantially equal to the standard impedance; and a low impedance transmission line, formed on the substrate, to connect the high efficiency amplifier and the non-reciprocal circuit element, the low impedance transmission line is formed at a distance from a ground potential, the distance being different from a distance between a transmission line of the standard impedance and the ground potential.

Preferably, the distance between the low impedance transmission line and the ground potential is shorter than the distance between transmission line of the standard impedance and the ground potential.

Thus, the radio transmission device as described above includes the low impedance high efficiency amplifier and the low impedance non-reciprocal circuit element, and the interval between the low impedance transmission line and the GND line is made narrower than the interval between the line of 50Ω, which is the standard impedance, and the GND line. Thus, the line width of the low impedance transmission line can be reduced. As a result, the radio transmission device can be reduced in size.

According to still further aspect of the present invention, a radio transmission device includes: a first transmission line of a first impedance; a second transmission line of a second impedance different from the impedance of the first transmission line; a high efficiency amplifier connected between the first transmission line and the second transmission line; and a non-reciprocal circuit element connected to the second transmission line; wherein the high efficiency amplifier includes an input terminal to receive an input signal from the first transmission line, an output terminal connected to the second transmission line, and an amplifier element arranged between the input terminal and the output terminal to amplify the input signal, and the input terminal and the output terminal are different in size corresponding to an impedance of a connected transmission line.

Preferably, the second impedance is lower than the first impedance and a size of the output terminal is larger than a size of the input terminal.

Thus, the radio transmission device as described above includes the low impedance high efficiency amplifier and the low impedance non-reciprocal circuit element and the input terminal and the output terminal in the low impedance high efficiency amplifier are formed in different size. Thus, the input terminal and the output terminal can be coupled with transmission lines with different impedance, respectively.

According to still further aspect of the present invention, a measuring device includes: a mount portion to mount a high efficiency amplifier having an output impedance lower than a standard impedance; a non-reciprocal circuit element having an input impedance lower than the standard impedance and an output impedance substantially equal to the standard impedance; a transmission line to electrically connect the high efficiency amplifier mounted on the mount portion and the non-reciprocal circuit element; and a circuit to measure an output from the non-reciprocal circuit element. An operation of the high efficiency amplifier mounted on the mount portion is measured based on an output from the non-reciprocal circuit element.

Particularly, the high efficiency amplifier includes, an input terminal to receive an input signal, an output terminal connected to the non-reciprocal circuit element via the transmission line, an amplifier element to amplify the input signal, and a harmonic processing circuit arranged between the amplifier element and the output terminal to process a harmonic in an output signal of the amplifier element.

In the measuring device according to the present invention, the low impedance non-reciprocal circuit element is connected to the low impedance high efficiency amplifier. Thus, the low impedance high efficiency amplifier can be evaluated with the measuring device operating for the standard impedance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
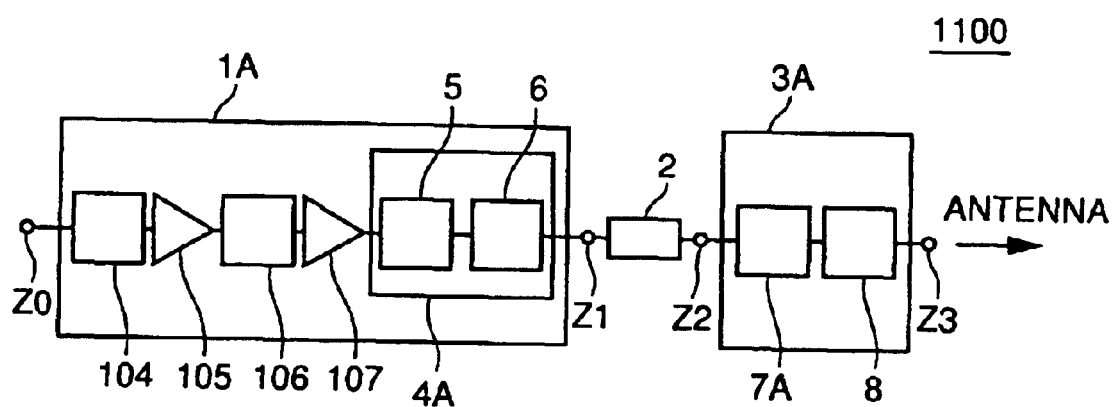
FIG. 1 is a block diagram showing a main portion of a radio transmission unit 1100 according to the first embodiment.

Hereinbelow, the preferred embodiments of the present invention will be described with reference to the drawings. In the drawings, the same or a corresponding portion will be denoted by the same reference character and the description thereof will not be repeated.

First Embodiment

With reference to FIG. 1, a structure according to the first embodiment will be described. A radio transmission unit 1100 shown in FIG. 1 includes a low impedance high efficiency amplifier 1A, a low impedance non-reciprocal circuit element 3A, and a low impedance transmission line 2 connecting low impedance high efficiency amplifier 1A and low impedance non-reciprocal circuit element 3A. An output terminal of low impedance non-reciprocal circuit element 3A is connected with an antenna not shown, and a signal supplied to an input terminal Z0 of low impedance high efficiency amplifier 1A is transmitted from the antenna via radio transmission unit 1100. Hereinbelow, an isolator will be described as an example of the low impedance non-reciprocal circuit element.

Low impedance high efficiency amplifier 1A has an input impedance satisfying the standard value, 50Ω, and an output impedance lower than the standard value 50Ω. Low impedance isolator 3A has an input impedance lower than the standard value 50Ω and an output impedance satisfying the standard value 50Ω.

Low impedance high efficiency amplifier 1A includes an input matching circuit 104, a first-stage amplifier 105, an interstage matching circuit 106, a second-stage amplifier 107 and an output matching circuit 4A. Between input terminal Z0 and an output terminal Z1 of low impedance high efficiency amplifier 1A, input matching circuit 104, first-stage amplifier 105, interstage matching circuit 106, second-stage amplifier 107 and output matching circuit 4A are connected in this order. Here, the number of the stages of the amplifiers can be changed according to a required gain.

Output matching circuit 4A is constituted of a harmonic processing circuit 5 and a fundamental wave regulator circuit 6. Harmonic processing circuit 5 is a circuit for processing a harmonic and has a circuit structure for matching the impedance of harmonic, for suppressing the harmonics-related leakage power and so on. For the impedance matching of harmonic, in some cases a structure is formed as a short circuit load with sufficiently low impedance for a higher order harmonic (even harmonic or odd harmonic), and in some cases a structure is formed as an open circuit load with sufficiently high impedance for a higher order harmonic. As a specific example, harmonic processing circuit 5 is formed as a resonance circuit which will be described later.

Next, the reason why harmonic processing circuit 5 is arranged between second-stage amplifier (last stage amplifier) 107 and low impedance isolator 3A will be described. The comparison will be made between the case in which the harmonic processing circuit is connected at the output side of the isolator and the case in which the harmonic processing circuit is connected at the input side of the isolator (the first embodiment). When the harmonic processing circuit is connected at the output side of the isolator, the harmonic-related leakage power becomes lower compared with the first embodiment, that is, when the characteristic impedance is low, because the characteristic impedance at the connected portion is 50Ω. When the harmonic processing circuit is connected at the output side of the isolator, however, the reflectance of the harmonics viewed from the second-stage amplifier 107 is small and the efficiency cannot be improved through the harmonic processing by second-stage amplifier 107.

When harmonic processing circuit 5 is connected between second-stage amplifier 107 and low impedance isolator 3A as in the first embodiment, the improvement in efficiency through the harmonic processing by second-stage amplifier 107 and the reduction in harmonic-related leakage power can be realized both at the same time.

Next, fundamental wave regulator circuit 6 will be described. In a conventional high efficiency amplifier (having an output impedance of the standard value of 50Ω), a fundamental wave matching circuit is used for converting the output impedance 1~10Ω of second-stage amplifier 107 to 50Ω.

On the other hand, low impedance high efficiency amplifier 1A is connected via low impedance transmission line 2 to low impedance isolator 3A. Hence, the fundamental wave matching circuit is not necessary for converting the impedance of the fundamental wave to 50Ω.

However, in some cases, mismatching may be caused from the variation in characteristic impedance or the like of the transmission line connecting the low impedance high efficiency amplifier and the low impedance isolator or the input impedance of the low impedance isolator. Hence, in place of the fundamental wave matching circuit converting the output impedance 1~10Ω of second-stage amplifier 107 to 50Ω, fundamental wave regulator circuit 6 for performing a fine control of the impedance for the fundamental wave is arranged in the first embodiment.

Figure 2:
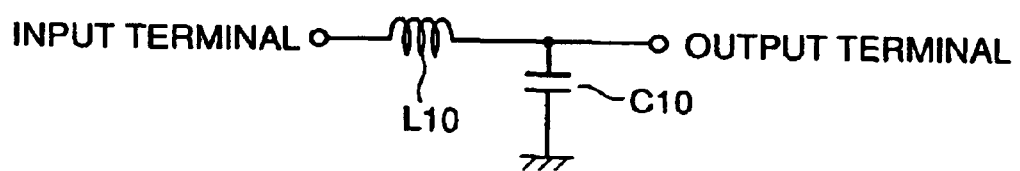
FIG. 2 is a circuit diagram showing an example of a structure of a fundamental wave regulator circuit 6A.

An example of fundamental wave regulator circuit 6 will be described with reference to FIG. 2. The fundamental wave regulator circuit shown in FIG. 2 is constituted of an inductor L10 connected between the input terminal and the output terminal and a capacitor C10 connected between the output terminal and a ground node GND receiving the ground potential. Inductor L10 and capacitor C10 form a low pass filter.

The amount of impedance transformation of fundamental wave regulator circuit 6 is about several Ω and lower than the amount of impedance transformation in the fundamental wave matching circuit. Hence, the power loss in fundamental wave regulator circuit 6 is smaller than in the fundamental wave matching circuit according to the first example of a conventional art.

Here, if the fine adjustment is not necessary, fundamental wave regulator circuit 6 may not be arranged.

Figure 3:
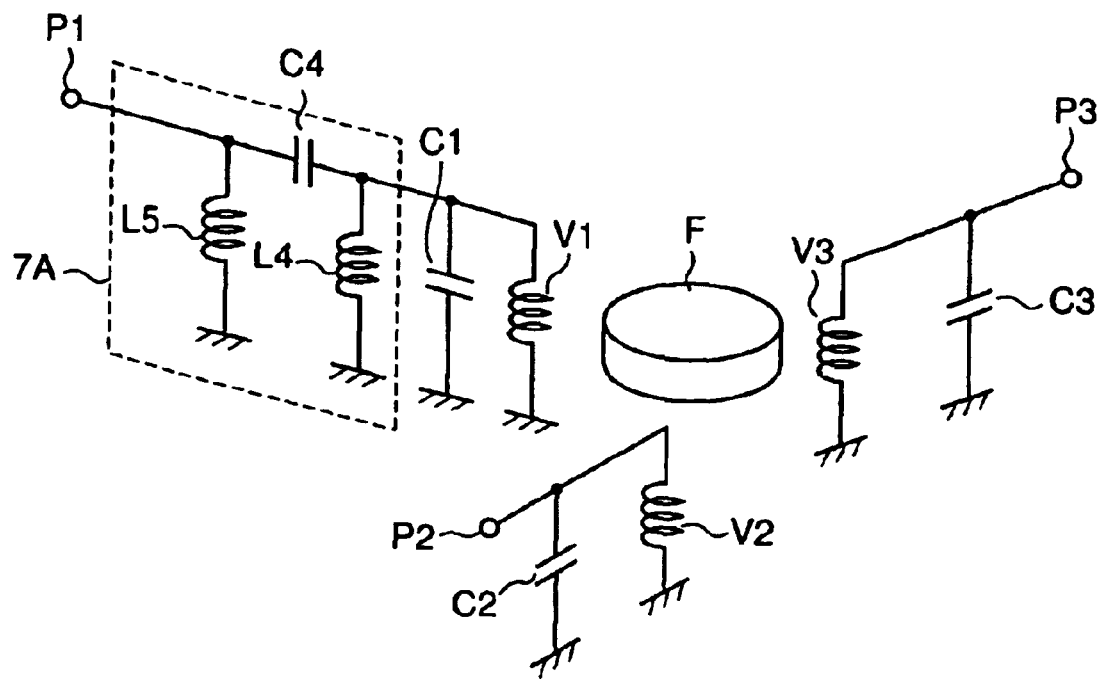
FIG. 3 shows an example of a structure of a low impedance isolator 3A.

Next, low impedance isolator 3A will be described. Low impedance isolator 3A is constituted of an input matching circuit 7A and an isolator body 8 as shown in FIG. 1. With reference to FIG. 3, an example of low impedance isolator 3A will be described. In low impedance isolator 3A shown in FIG. 3, three center electrodes V1, V2, V3 are arranged to form a certain angle therebetween in an electrically insulated state and a ferrite F is arranged at a position where the directions of extension of these three center electrodes intersect. To ferrite F, a direct current magnetic field is applied.

Between center electrodes V1, V2, V3 and ports P1, P2, P3, matching capacitors C1, C2, C3 are connected in parallel, respectively. A transmission signal received at port P1 is transmitted to port P2. Reflected wave entering from port P2 is absorbed at a termination element not shown connected to port P3.

At port P1, input matching circuit 7A is arranged, constituted of a capacitor C4 connected in series with port P1, an inductor L4 connected between one terminal of capacitor C4 and a ground node GND and an inductor L5 connected between another terminal of capacitor C4 and ground node GND.

Impedance of ports P2 and P3 is 50Ω and impedance of port P1 is lower than 50Ω.

Figure 4:
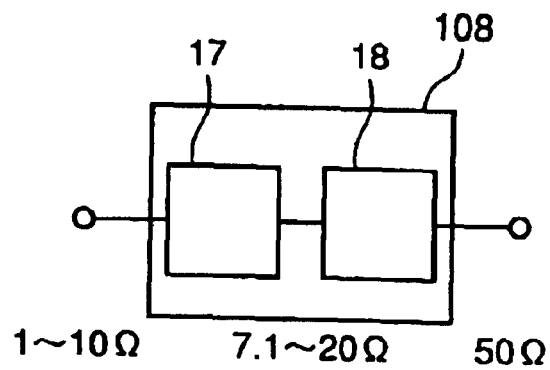
FIG. 4 is a diagram showing an example of a structure of a conventional output matching circuit 108 and impedance in the circuit.
Figure 6:
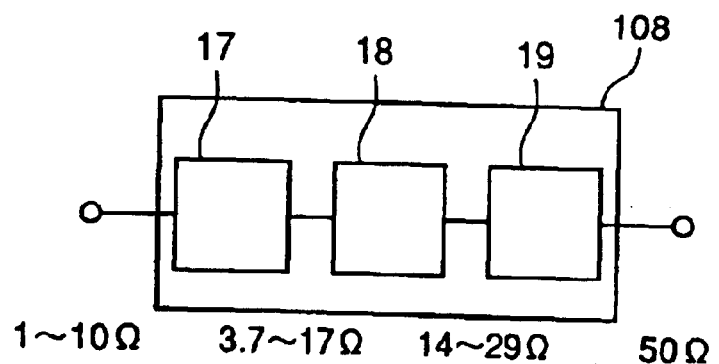
FIG. 6 is a diagram of an example of a structure of conventional output matching circuit 108 and impedance in the circuit.

Next, the impedance between low impedance high efficiency amplifier 1A and low impedance isolator 3A will be described. For comparison, examples of structures of the output matching circuit in the conventional high efficiency amplifier is shown in FIGS. 4 and 6. FIG. 4 is a block diagram showing output matching circuit 108 in a two stage structure and FIG. 6 is a block diagram showing output matching circuit 108 in a three stage structure.

In output matching circuit 108 shown in FIG. 4, a first stage matching circuit 17 serves as a harmonic processing circuit and a second stage matching circuit 18 serves as a fundamental wave matching circuit. Assume that the ratio of impedance transformation is same in both the first stage and the second stage matching circuits. The output impedance of second-stage amplifier 107 is 1~10Ω.

In this case, the input impedance of output matching circuit 108 is 1~10Ω, the impedance between first stage matching circuit 17 and second stage matching circuit 18 is 7.1~20Ω and the output impedance of output matching circuit 108 is 50Ω.

Figure 5:
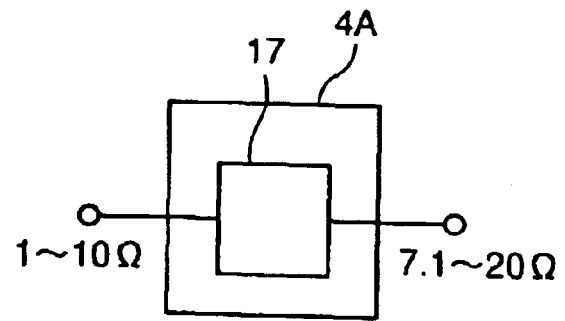
FIG. 5 is a diagram referenced for describing impedance between high efficiency amplifier 1A and an isolator 3A.

Whereas, output matching circuit 4A according to the first embodiment does not include a fundamental wave matching circuit. Hence, the output of first stage matching circuit (harmonic processing circuit) 17 is the output of low impedance high efficiency amplifier 1A as shown in FIG. 5.

Therefore, the output impedance of low impedance high efficiency amplifier 1A is 7.1~20Ω. First stage matching circuit 17 in FIG. 5 corresponds to harmonic processing circuit 5 shown in FIG. 1.

In output matching circuit 108 shown in FIG. 6, first stage matching circuit 17 corresponds to a harmonic processing circuit and second and third stage matching circuits 18 and 19 correspond to a fundamental wave matching circuit, for example. Here, first, second and third stage matching circuits 17, 18 and 19 are all assumed to have the same impedance transformation ratio.

In this case, the input impedance of output matching circuit 108 is 1~10Ω, the impedance between first stage matching circuit 17 and second stage matching circuit 18 is 3.7~17Ω, the impedance between second stage matching circuit 18 and third stage matching circuit 19 is 14~29Ω and the output impedance of output matching circuit 108 is 50Ω.

Figure 7:
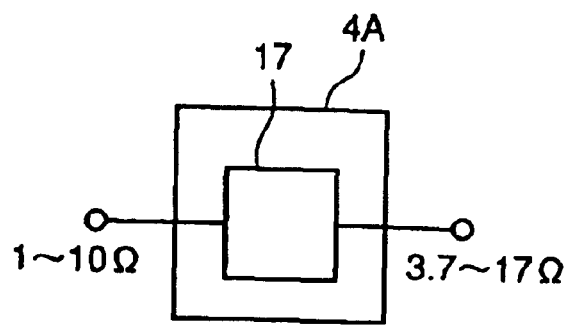
FIG. 7 is a diagram referenced for describing impedance between high efficiency amplifier 1A and an isolator 3A.

On the other hand, output matching circuit 4A according to the first embodiment does not include a fundamental wave matching circuit. Hence, the output of first matching circuit (harmonic processing circuit) 17 is the output of low impedance high efficiency amplifier 1A as shown in FIG. 7. The output impedance of low impedance high efficiency amplifier 1A is 3.7~17Ω. First stage matching circuit 17 shown in FIG. 7 corresponds to harmonic processing circuit 5 shown in FIG. 1.

In another example of output matching circuit 108, first and second stage matching circuits 17 and 18 shown in FIG. 6 may serve as a harmonic processing circuit and third stage matching circuit 19 may serve as a fundamental wave matching circuit.

Figure 8:
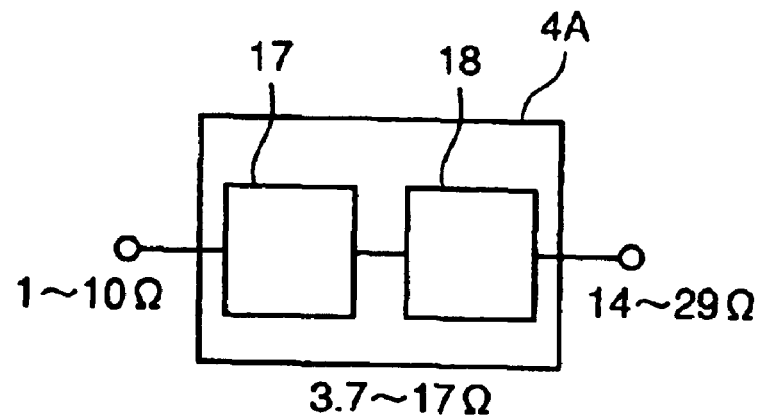
FIG. 8 is a diagram referenced for describing impedance between high efficiency amplifier 1A and an isolator 3A.

On the other hand, output matching circuit 4A according to the first embodiment does not include a fundamental wave matching circuit. Hence, the output of second stage matching circuit (harmonic processing circuit) 18 is the output of low impedance high efficiency amplifier 1A as shown in FIG. 8. Hence, the output impedance of low impedance high efficiency amplifier 1A is 14~29Ω. First stage matching circuit 17 and second stage matching circuit 18 shown in FIG. 8 correspond to harmonic processing circuit 5 shown in FIG. 1.

According to these examples, the output impedance of low impedance high efficiency amplifier 1A is substantially in the range of 3Ω~30Ω.

Thus, compared with the structure according to the second example of a conventional art, the first embodiment allows the improvement in efficiency of the second-stage amplifier and the reduction in harmonic-related leakage power because the first embodiment includes a harmonic processing circuit between the second-stage amplifier and the isolator.

Figure 9:
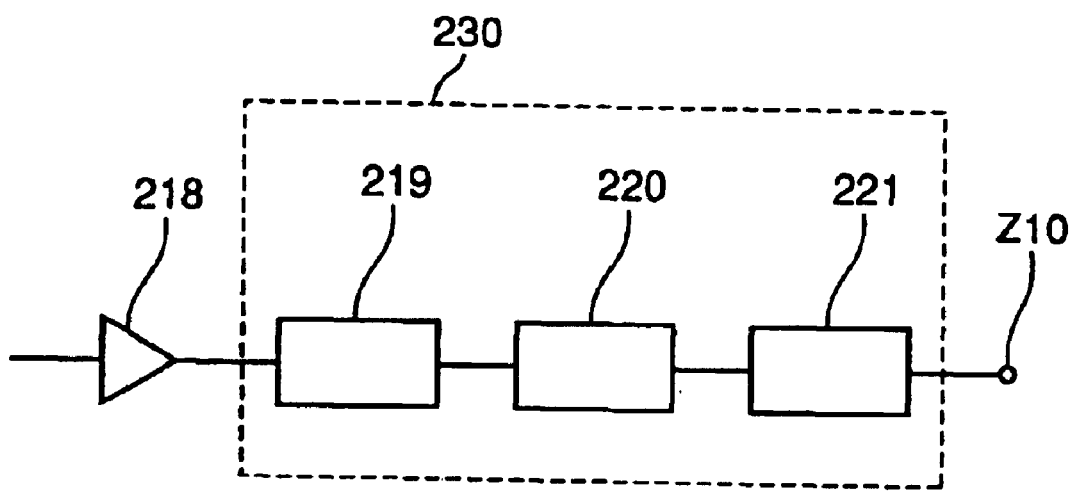
FIG. 9 is a block diagram showing a structure of an output matching circuit 230 including a harmonic processing circuit.

The improvement in the efficiency can be achieved by using, for example, an output matching circuit described below in the conventional high efficiency amplifier for 50Ω. An output matching circuit 230 shown in FIG. 9 is constituted of a third harmonic matching circuit 219, a second harmonic matching circuit 220 and a fundamental wave matching circuit 221, sequentially connected between a second-stage amplifier 218 (corresponding to amplifier 107) and an output terminal Z10 of the high efficiency amplifier.

For example, second harmonic matching circuit 220 has a structure to form an open circuit load with a sufficiently high impedance for even harmonic, and third harmonic matching circuit 219 has a structure to form a short circuit load with a sufficiently low impedance for odd harmonic. With such structure, the efficiency of the second-stage amplifier is improved and the current consumption can be decreased.

Figure 32:
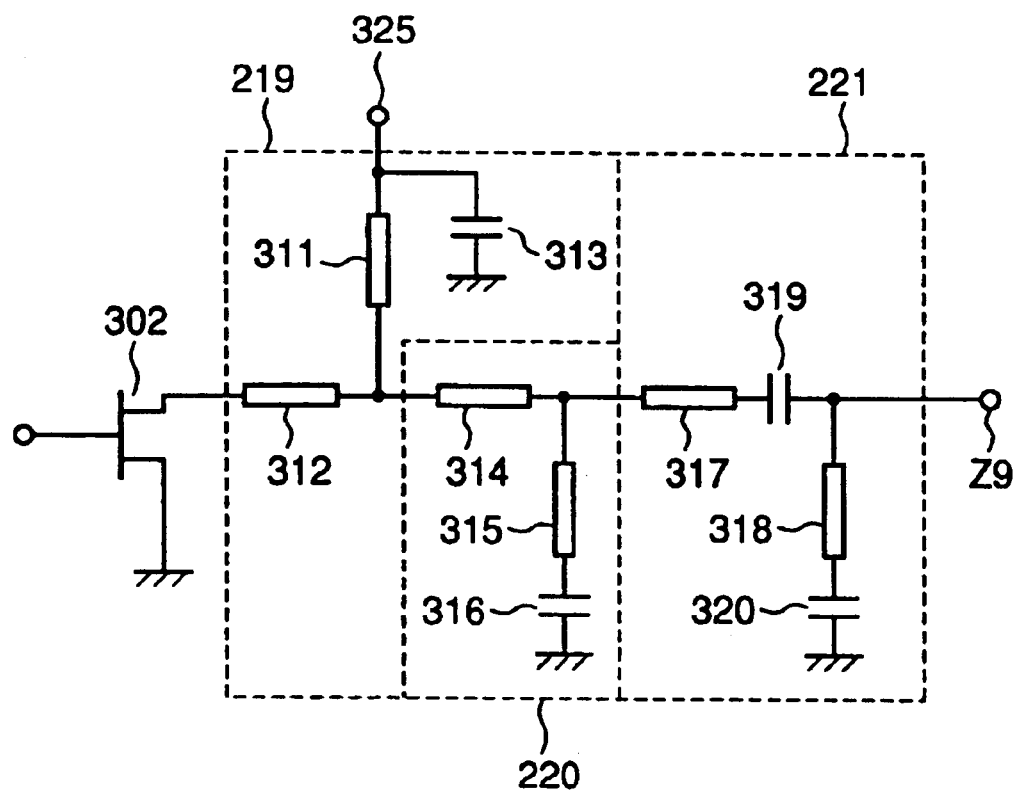
FIG. 32 is a circuit diagram showing a structure of an output matching circuit 230.

A more specific structure will be shown in FIG. 32. With reference to FIG. 32, third harmonic matching circuit 219 includes a drain bias line 311, signal line 312 and capacitor 313, and second harmonic matching circuit 220 includes signal lines 314 and 315 and a capacitor 316. Fundamental wave matching circuit 221 includes signal lines 317 and 318 and capacitors 319 and 320. An FET (field effect transistor) 302 included in second-stage amplifier 218 has a drain connected to signal line 312 and a source connected to ground.

Signal line 312 is connected to drain bias terminal 325 supplying a bias voltage via drain bias line 311. Capacitor 313 is connected between drain bias terminal 325 and the ground potential. Signal line 315 and capacitor 316 are connected between signal line 314 coupling signal lines 312 and 317 and the ground potential. Capacitor 319 is connected between signal line 317 and an output terminal Z9, and signal line 318 and capacitor 320 are connected between output terminal Z9 and the ground potential.

Compared with the second example of the conventional art, the efficiency of the second-stage amplifier is improved because the harmonic matching circuit (third harmonic matching circuit 219 and second harmonic matching circuit 220) is included.

In such structure, however, the loss in output matching circuit 230 is high because fundamental wave matching circuit 221 is arranged. Conversely, low impedance high efficiency amplifier 1A does not include a fundamental wave matching circuit.

Hence, compared with the harmonic processing circuit including output matching circuit 230 performing the harmonic processing alone, the current consumption can be reduced in low impedance high efficiency amplifier 1A by the amount of loss generated in the fundamental wave matching circuit.

In the above description, the frequency to be subjected to harmonic processing is assumed to be one frequency. This, however, is not a limiting example and the harmonic processing can be performed on a plurality of frequencies.

Second Embodiment

Figure 10:
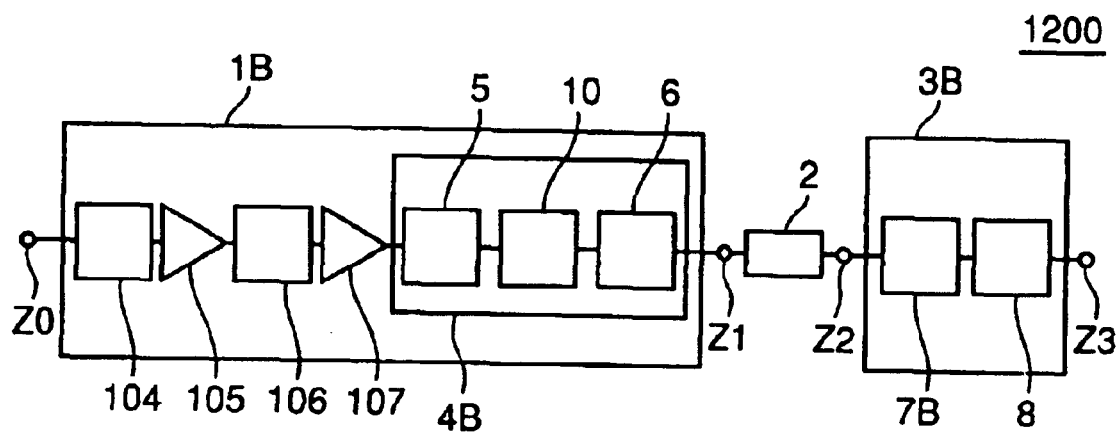
FIG. 10 is a block diagram showing a main portion of a radio transmission unit 1200 according to the second embodiment.

A structure of a radio transmission unit 1200 according to the second embodiment will be described with reference to FIG. 10. Radio transmission unit 1200 shown in FIG. 10 includes a low impedance high efficiency amplifier 1B, a low impedance transmission line 2 and a low impedance isolator 3B. Similar to low impedance high efficiency amplifier 1A, low impedance high efficiency amplifier 1B has an input impedance satisfying the standard value of 50Ω and an output impedance lower than the standard value 50Ω. Low impedance isolator 3B has an input impedance lower than the standard value 50Ω and an output impedance satisfying the standard value of 50Ω.

Low impedance isolator 3B includes an input matching circuit 7B and an isolator body 8. Input matching circuit 7B has the same structure as input matching circuit 7A.

Low impedance high efficiency amplifier 1B includes output matching circuit 4B instead of output matching circuit 4A in the first embodiment. Between input terminal Z0 and output terminal Z1 of low impedance high efficiency amplifier 1B, an input matching circuit 104, a first-stage amplifier 105, an interstage matching circuit 106, a second-stage amplifier 107 and an output matching circuit 4B are connected in this order.

Figure 11:
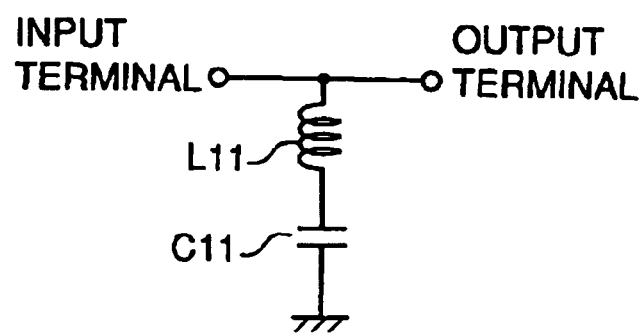
FIG. 11 is a circuit diagram showing an example of a structure of a harmonic processing circuit.

Output matching circuit 4B, in addition to harmonic processing circuit 5 and fundamental wave regulator circuit 6, includes a harmonic processing circuit 10. An example of structures of harmonic processing circuits 5 and 10 is shown in FIG. 11. A harmonic processing circuit shown in FIG. 11 is constituted as a resonance circuit including an inductor L11 and a capacitor C11 connected in series between a signal line connecting an input terminal and an output terminal and a ground node GND.

Figure 12:
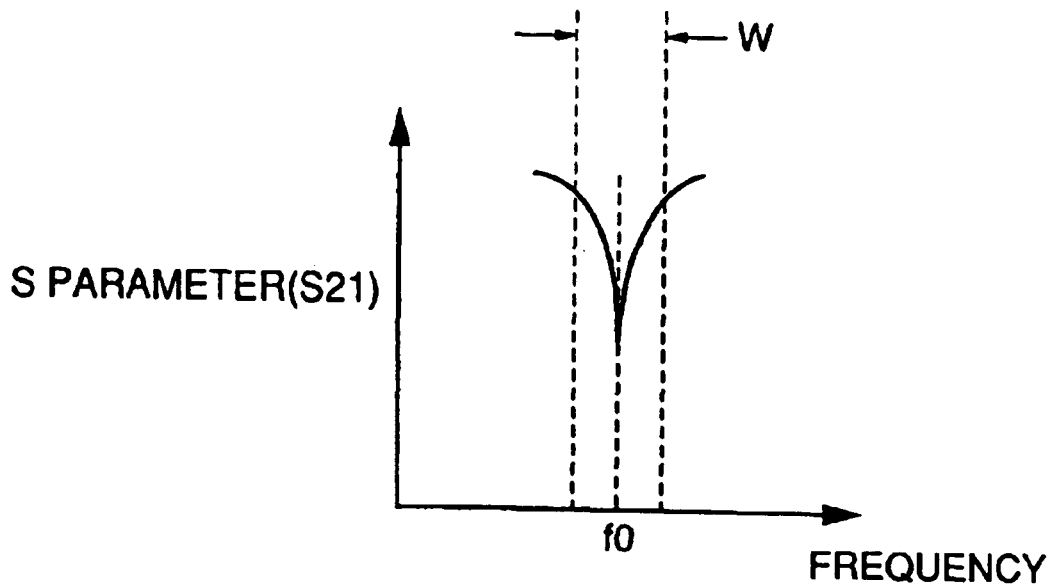
FIG. 12 is a graph referenced for describing a resonance frequency in a harmonic processing circuit.

When the harmonic processing circuit is constituted as the resonance circuit including inductor L11 and capacitor C11, harmonic-related leakage power can be reduced by matching the resonance frequency to a center (f0) of higher order harmonics band W as shown in FIG. 12. When the band range of the radio transmission device is wide, however, sufficient reflectance cannot be obtained at the periphery of high order harmonics band W even if the resonance frequency is matched with the center f0, and the reduction in harmonics-related leakage power may not be sufficient.

Hence, to improve this feature, in the second embodiment, two harmonic processing circuits are connected between second-stage amplifier 107 and low impedance isolator 3B. Thus the effect of rejection of harmonic can be increased.

Figure 13:
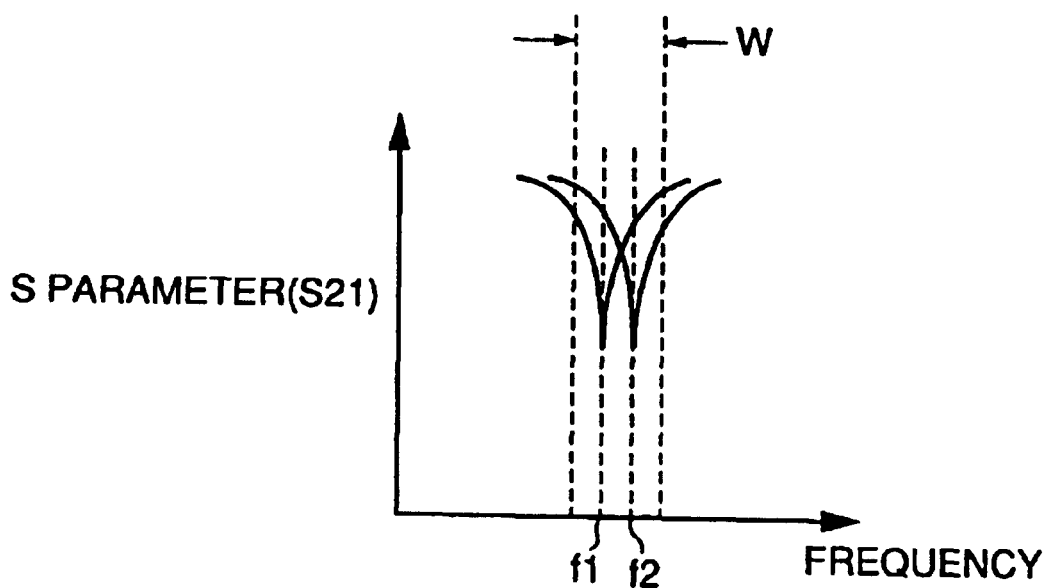
FIG. 13 is a graph referenced for describing relation of resonance frequencies in harmonic processing circuits 5 and 10 according to the second embodiment.

In addition, as shown in FIG. 13, by making the resonance frequency of two harmonic processing circuits 5 and 10 according to the second embodiment slightly different from each other (f1, f2), the effect of rejection of harmonic-related power leakage at the periphery of high order harmonics band W can be improved.

Though, in the above description, the resonance circuit constituted of inductor L11 and capacitor C11 has been described as an example of the structure of the harmonic processing circuit, the structure of the harmonic processing circuit is not limited thereto. The harmonic processing circuit can be constituted of a capacitance element and a parasitic inductor as in a chip capacitor and a Microstrip Transmission Line or a chip capacitor and an interstitial via hole provided on a substrate.

Though the band reject filter is used in the second embodiment, a low pass filter may also be used.

In addition, though two harmonic processing circuits are arranged in the second embodiment, more than two harmonic processing circuits may be arranged.

In addition, though the description was provided on the harmonic processing of one frequency, harmonic processing may be performed on a plurality of frequencies.

Third Embodiment

Figure 14:
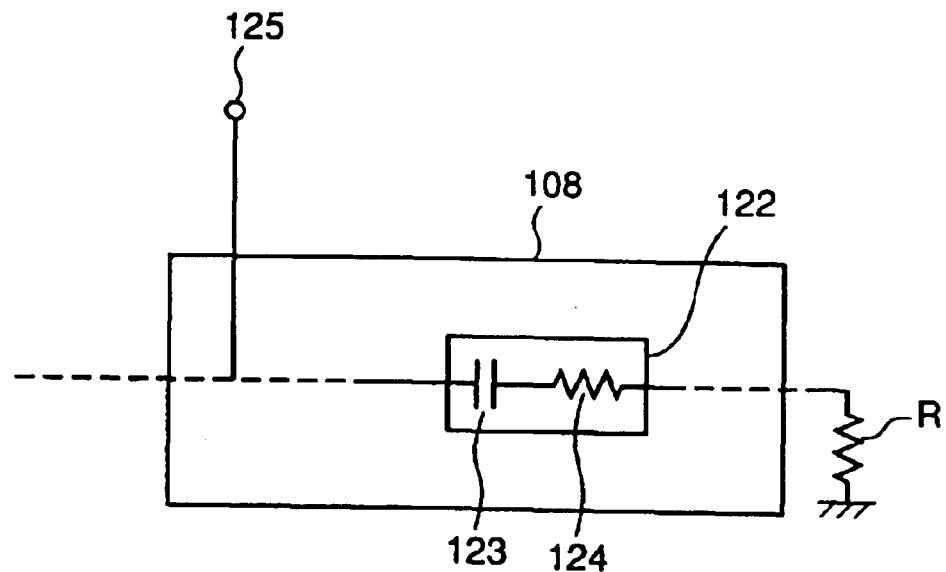
FIG. 14 is a diagram showing a structure of a main portion of a conventional output matching circuit 108.

Third embodiment relates to the reduction of loss at the output matching circuit of the low impedance high efficiency amplifier. First, for comparison, a structure of a conventional output matching circuit 108 will be described with reference to FIG. 14. In FIG. 14, reference character 122 denotes a chip capacitor, reference character 125 denotes a drain bias terminal, and reference character R denotes a resistance element connected between an output terminal and a ground node. Further, reference character 123 denotes a capacitance of chip capacitor 122 and reference character 124 denotes a parasitic resistance of chip capacitor 122. Output matching circuit 108 includes drain bias terminal 125 receiving a bias voltage to be supplied to a drain of an FET constituting a final stage amplifier.

Thus in the high efficiency amplifier, chip capacitor 122 is generally arranged in series in the output matching circuit such that a DC (direct current) bias voltage will not be applied on the output terminal.

Here, when the series resistance of chip capacitor 122 is about 1Ω, the loss will be produced through chip capacitor 122. In the combination of the high efficiency amplifier operating for 50Ω and the isolator, the loss to be generated for the output impedance (50Ω) of the high efficiency amplifier will be about 1Ω. When low impedance high efficiency amplifiers 1A and 1B are combined with low impedance isolators 3A and 3B, however, the loss of as much as about 1Ω will be produced for the output impedance (3Ω~29Ω) of the low impedance high efficiency amplifier. Thus, the loss will increase compared with the conventional case.

Figure 15:
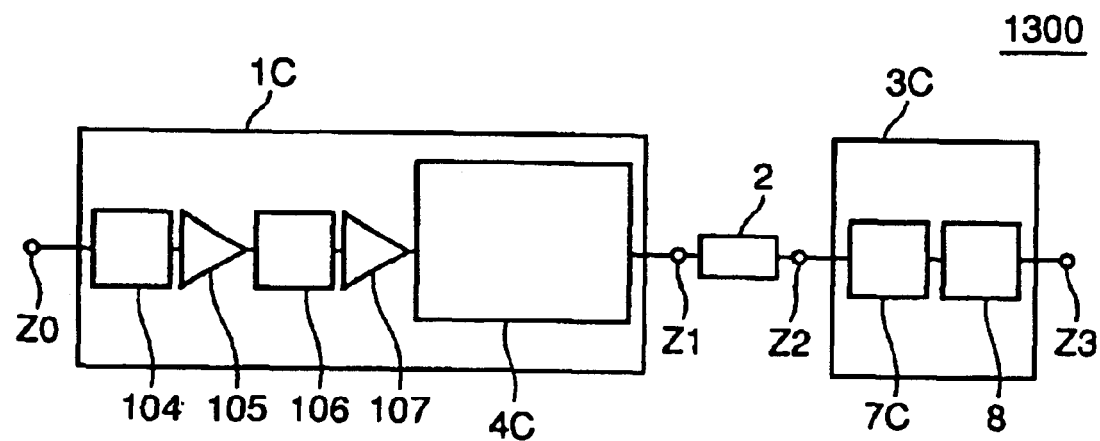
FIG. 15 is a block diagram showing a main portion of a radio transmission unit 1300 according to the third embodiment.

Hence, in the third embodiment, a radio transmission unit 1300 is constituted as shown in FIG. 15. A low impedance high efficiency amplifier 1C shown in FIG. 15 includes amplifiers 105, 107, an input matching circuit 104, an interstage matching circuit 106 and an output matching circuit 4C. Output matching circuit 4C is arranged such that there is no capacitor connected in series with a transmission line formed between the input terminal and the output terminal. A low impedance isolator 3C connected to low impedance high efficiency amplifier 1C via low impedance transmission line 2 includes an input matching circuit 7C and an isolator body 8.

Low impedance high efficiency amplifier 1C has an input impedance satisfying the standard value of 50Ω and an output impedance lower than the standard value 50Ω. Low impedance isolator 3C has an input impedance lower than the standard value of 50Ω and an output impedance of the standard value 50Ω.

Figure 16:
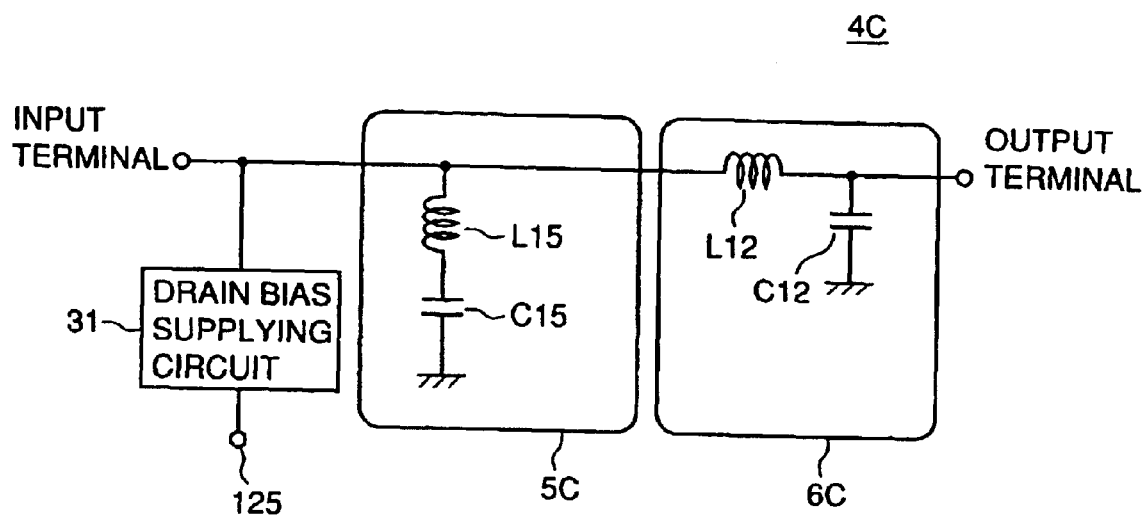
FIG. 16 is a diagram showing a structure of a main portion of an output matching circuit 4C according to the third embodiment.

An example of output matching circuit 4C according to the third embodiment will be described with reference to FIG. 16. Output matching circuit 4C shown in FIG. 16 includes a drain bias supplying circuit 31 connected between a drain bias terminal 125 and the transmission line, a harmonic processing circuit 5C constituted of an inductor L15 and a capacitor C15, and a fundamental wave regulator circuit 6C constituted of an inductor L12 and a capacitor C12.

Inductor L15 and capacitor C15 are connected in series between the transmission line connecting the input terminal and the output terminal and ground node GND. Inductor L12 is connected between the transmission line and the output terminal and capacitor C12 is connected between the transmission line and ground node GND.

Figure 17:
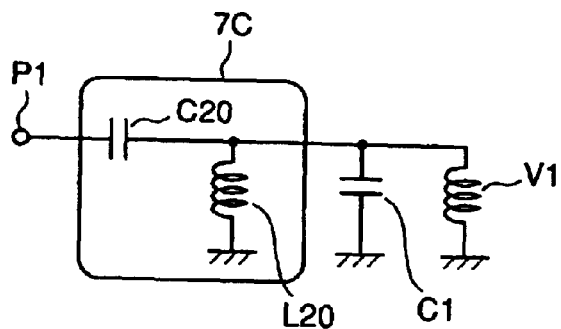
FIG. 17 is a diagram referenced for describing a structure of a low impedance isolator according to the third embodiment.

Further, low impedance isolator 3C is constituted as shown in FIG. 17. In FIG. 17, a structure between a port P1 and a center electrode V1 is shown. Other portion is same with that shown in FIG. 3. Instead of input matching circuit 7A constituted of capacitor C4 and inductors L4 and L5, input matching circuit 7C is arranged. Input matching circuit 7C is constituted of a capacitor C20 connected in series with port P1 and an inductor L20 connected between one terminal of capacitor C20 and ground node GND.

With such structure, the reduction in loss caused by the series resistance of series capacitor in the output matching circuit can be achieved. Further, the reduction in current consumption in the low impedance high efficiency amplifier is allowed. Still further, the DC bias component can be rejected through capacitor C20 connected in series and arranged at the side of the low impedance isolator.

Fourth Embodiment

Figure 18:
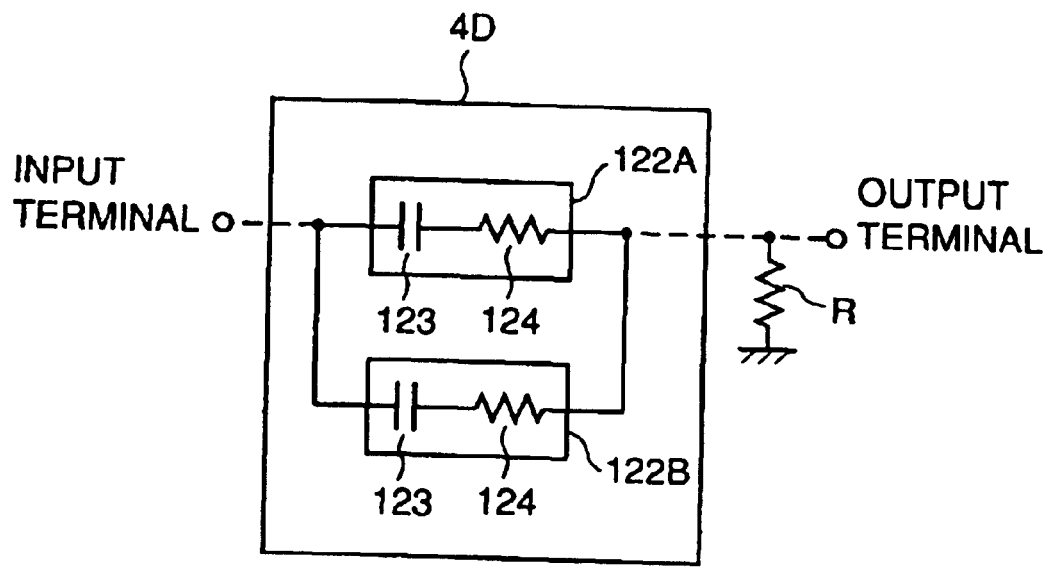
FIG. 18 shows a structure of a main portion of an output matching circuit 4D according to the fourth embodiment.

Similar to the third embodiment, the fourth embodiment is intended to reduce the loss at the output matching circuit in the low impedance high efficiency amplifier. As shown in FIG. 18, an output matching circuit 4D according to the fourth embodiment includes chip capacitors arranged in parallel between the input terminal and the output terminal. In the figure, chip capacitors 122A and 122B arranged in parallel are shown as representatives. Here, in the figure, reference character 123 denotes capacitance of the chip capacitor and reference character 124 denotes parasitic resistance.

A basic structure of output matching circuit 4D is same with those of output matching circuits 4A, 4B, . . . and includes chip capacitors 122A and 122B connected in parallel. Chip capacitors 122A and 122B are arranged, for example, in fundamental wave regulator circuit 6.

With such structure, the series resistance of the series capacitor in the output matching circuit can be reduced and the loss can be decreased. As a result, the current consumption in the low impedance high efficiency amplifier can be reduced.

Fifth Embodiment

The fifth embodiment relates to the structure for adjusting the impedance of the fundamental wave of the low impedance high efficiency amplifier. As described above, in the conventional high efficiency amplifier, the impedance of the fundamental wave viewed from the second-stage amplifier is adjusted through the fundamental wave matching circuit constituted of an inductance and a capacitance connected in series, a parallel capacitor or the like.

In the low impedance high efficiency amplifier, however, the characteristic in the high efficiency amplifier cannot be adjusted because the fundamental wave matching circuit is not connected.

Figure 19:
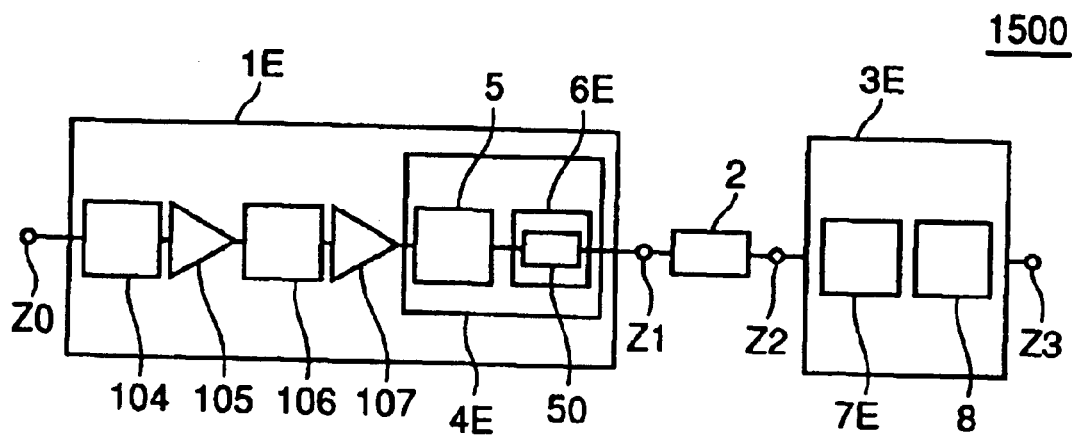
FIG. 19 is a diagram referenced for describing a main portion of a radio transmission unit 1500 according to the fifth embodiment.

Hence, in the fifth embodiment, a structure for adjusting the line width of the transmission line for transmitting a signal is provided in the fundamental wave regulator circuit. As shown in FIG. 19, a radio transmission unit 1500 according to the fifth embodiment includes a low impedance high efficiency amplifier 1E, a low impedance transmission line 2 and a low impedance isolator 3E. Low impedance high efficiency amplifier 1E has an input impedance satisfying the standard value of 50Ω and an output impedance lower than the standard value 50Ω. Low impedance isolator 3E has an input impedance lower than the standard value of 50Ω and an output impedance satisfying the standard value of 50Ω.

Low impedance isolator 3E includes an input matching circuit 7E and an isolator body 8. Input matching circuit 7E has a similar structure with input matching circuits 7A, 7B, . . . .

Low impedance high efficiency amplifier 1E includes an input matching circuit 104, a first-stage amplifier 105, an interstage matching circuit 106, a second-stage amplifier 107 and an output matching circuit 4E.

Output matching circuit 4E includes harmonic processing circuit 5 and a fundamental wave regulator circuit 6E. Fundamental wave regulator circuit 6E has a similar structure to fundamental wave regulator circuit 6 and allows the change in line width of a low impedance transmission line 50 transmitting a signal.

Figure 20A:
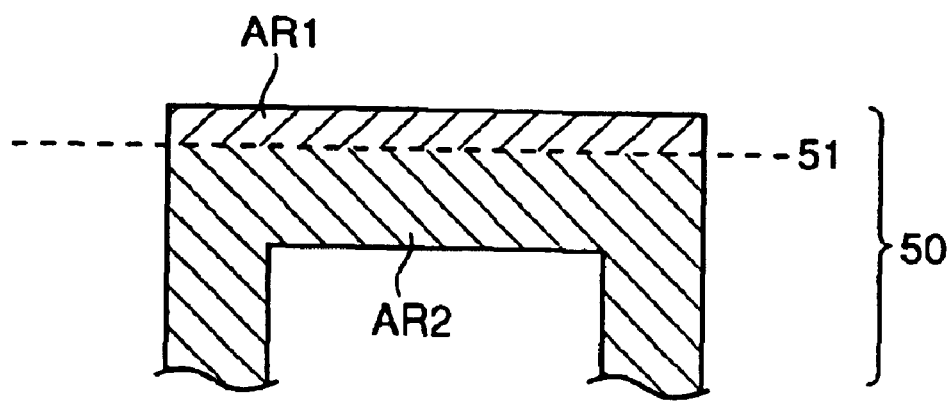
FIGS. 20A and 20B are diagrams referenced for describing a first approach of transmission line width adjustment according to the fifth embodiment.
Figure 20B:
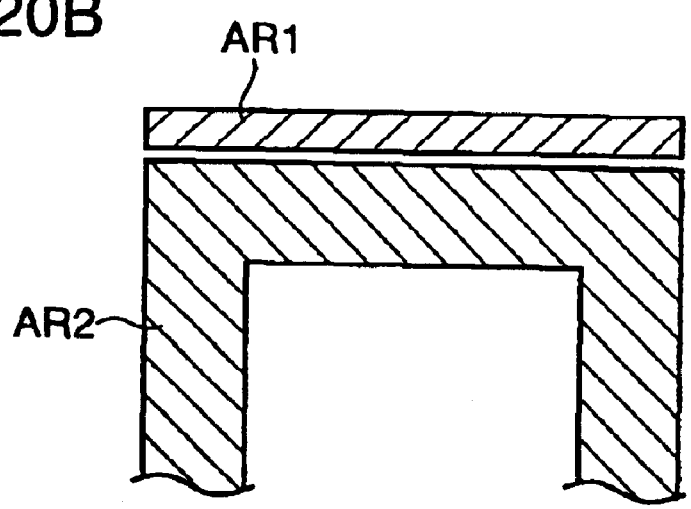

An example of adjustment of the line width will be described with reference to top plan views in FIGS. 20A, 20B and 21A and 21B. As a first example of line width adjustment, a blow portion 51 which can be blown by a laser is provided in transmission line 50 as shown in FIG. 20A. Blow portion 51 divides transmission line 50 into a region AR1 and a region AR2. When impedance matching is to be performed, blow portion 51 is blown by a laser as shown in FIG. 20B. Then, region AR1 is cut from transmission line 50. As a result, a signal is transmitted without passing through region AR1. Thus the line width of the transmission line is changed.

Figure 21A:
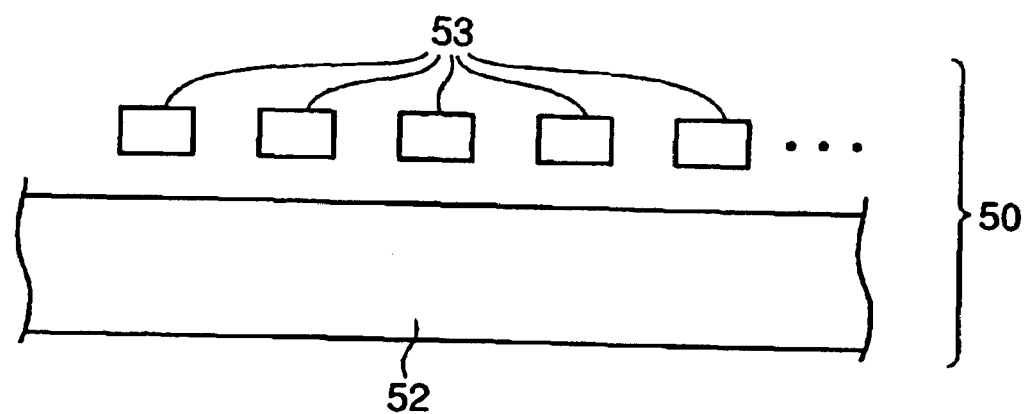
FIGS. 21A and 21B are diagrams referenced for describing a second approach of transmission line width adjustment according to the fifth embodiment.
Figure 21B:
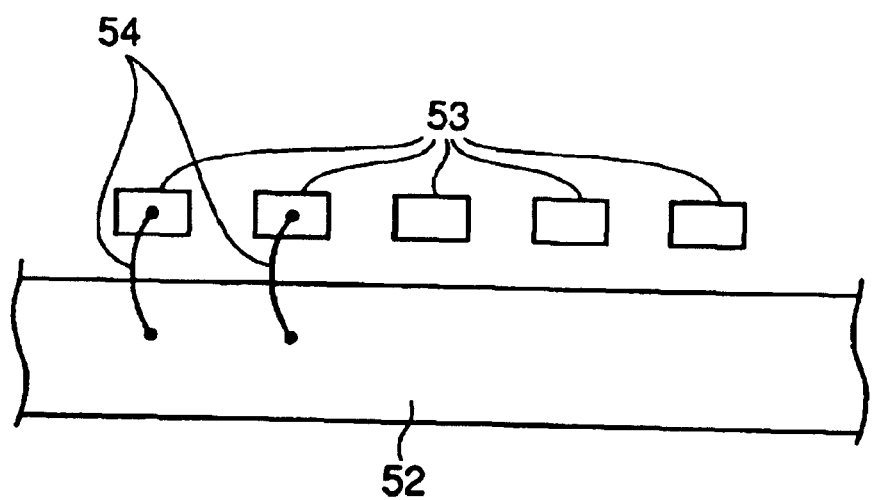

Further, as a second example of line width adjustment, pads 53 are arranged in the neighborhood of a transmission line 52 as shown in FIG. 21A. When impedance matching is to be performed, pad 53 and transmission line 52 are connected with a signal line 54 such as a gold ribbon as shown in FIG. 21B. The number of pads to be connected is changed according to the amount of impedance transformation. Thus the width of the transmission line is changed.

According to these adjustment, the impedance matching of the fundamental waves can be performed without using the fundamental wave matching circuit.

Sixth Embodiment

Figure 22:
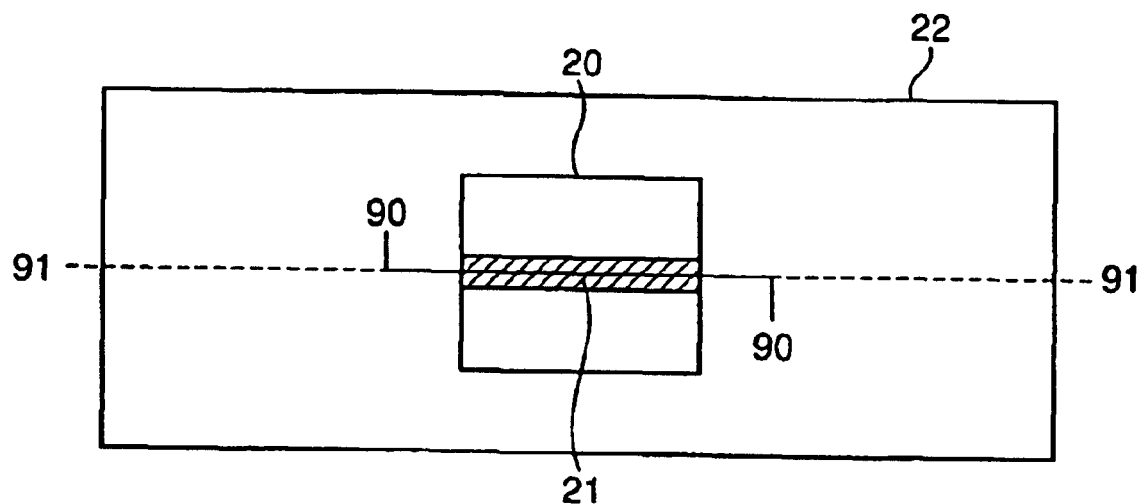
FIG. 22 is a top plan view referenced for conceptually describing a structure of a low impedance transmission line according to the sixth embodiment.

The sixth embodiment relates to a structure of the low impedance transmission line. The structure of the low impedance transmission line will be described with reference to FIGS. 22 and 23. FIG. 22 is a top plan view referenced for conceptually describing the structure of the low impedance transmission line. With reference to FIG. 22, reference character 22 denotes a substrate on which the high efficiency amplifier is formed, reference character 20 denotes a high-dielectric constant substrate formed on substrate 22, and reference character 21 denotes a low impedance transmission line formed on high-dielectric constant substrate 20. In the drawing, reference character 21 represents only a portion of the low impedance transmission line and the low impedance transmission line is arranged in a direction 91—91 of substrate 22.

Figure 23:
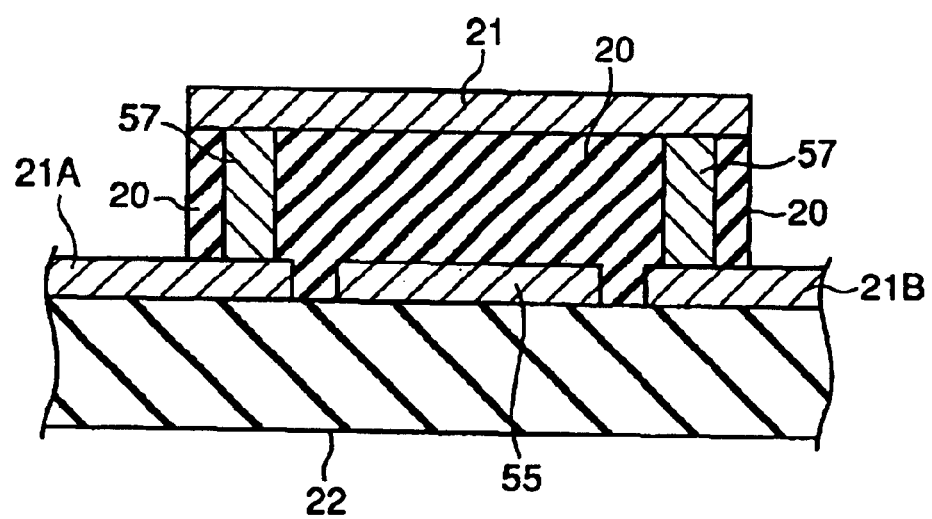
FIG. 23 is a diagram referenced for conceptually describing an example of a structure in a cross section of a low impedance transmission line according to the sixth embodiment.

FIG. 23 is a diagram referenced for describing a structure in a cross section of the low impedance transmission line when blown along line 90—90 of FIG. 22. In FIG. 23, reference characters 21A and 21B denote the low impedance transmission line, reference character 55 denotes a surface of a ground potential (GND surface) and reference character 57 denotes a via contact.

On substrate 22, GND surface 55 is formed. Low impedance transmission lines 21A and 21B are formed on substrate 22 at a certain interval such that low impedance transmission lines sandwich GND surface 55. On GND surface 55 and low impedance transmission lines 21A and 21B, high-dielectric constant substrate 20 is applied such that high-dielectric constant substrate 20 surrounds GND surface 55 and end portions of low impedance transmission lines 21A and 21B. On high-dielectric constant substrate 20, low impedance transmission line 21 is formed. Low impedance transmission line 21 and low impedance transmission lines 21A and 21B are electrically connected via via contact 57. A signal is transmitted from low impedance transmission line 21A to low impedance transmission lines 21 and 21B (or from low impedance transmission line 21B to low impedance transmission lines 21 and 21A).

High-dielectric constant substrate 20 is formed with a material with higher dielectric constant than substrate 22.

As the output impedance of the conventional high efficiency amplifier is 50Ω, the transmission line to transmit a signal in the high efficiency amplifier is designed based on 50Ω. In the low impedance high efficiency amplifier 1 (1A, 1B, . . . ) described above, however, the output impedance is 3~30Ω. Hence, when the high efficiency amplifier substrate with the same thickness and the same dielectric constant with the conventional high efficiency amplifier is used, the transmission line width becomes wider and the low impedance high efficiency amplifier becomes larger.

Hence, in the sixth embodiment, high-dielectric constant substrate 20 is applied on the low impedance transmission line of the impedance lower than 50Ω to make the transmission line width narrower. Thus, the size of low impedance high efficiency amplifier 1 can be reduced.

Figure 33:
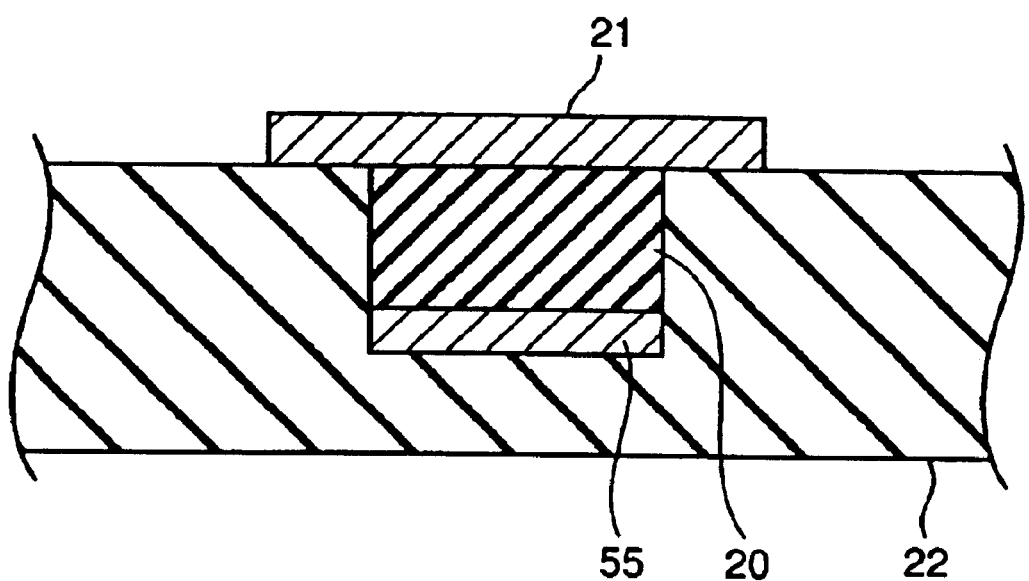
FIG. 33 is a diagram referenced for describing another example of a structure in cross section of a low impedance transmission line according to the sixth embodiment.

The structure in which high-dielectric constant substrate 20 is arranged over high efficiency amplifier substrate 22 described above is not a limiting example and a structure in which high-dielectric constant substrate 20 is buried in high efficiency amplifier substrate 22 (low dielectric constant material) as shown in FIG. 33 can be employed. In this case, at a bottom surface of buried high-dielectric constant material 20, GND surface 55 is formed and on an upper surface of high-dielectric constant substrate 20, low impedance transmission line 21 is formed.

Seventh Embodiment

Figure 24:
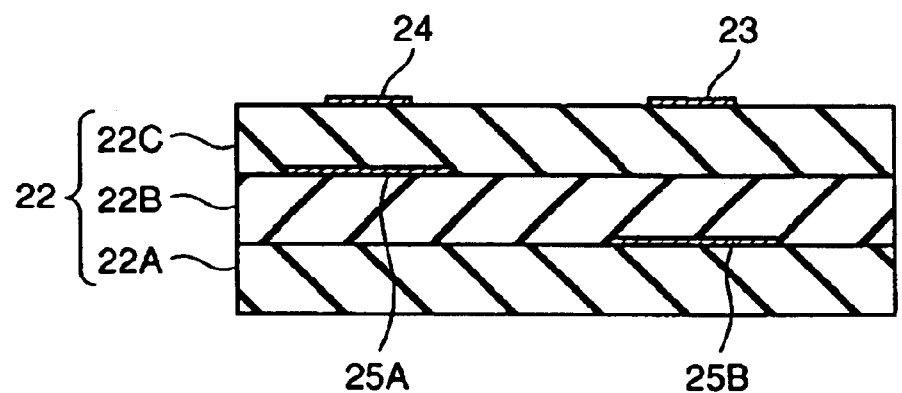
FIG. 24 is a diagram referenced for conceptually describing a structure in cross section of a low impedance transmission line according to the seventh embodiment.

Similar to the sixth embodiment, the seventh embodiment is intended to reduce the line width of the low impedance transmission line. A structure according to the seventh embodiment will be described with reference to FIG. 24. FIG. 24 is a cross section referenced for describing a structure of the low impedance transmission line in the high efficiency amplifier substrate. In FIG. 24, reference character 22 denotes a substrate of ceramic, resin or the like for forming the high efficiency amplifier and constituted of three insulation layers 22A, 22B and 22C, reference characters 25A and 25B denote GND lines transmitting ground potential, reference character 23 denotes a transmission line (50Ω line) to transmit a signal of 50Ω, and reference character 24 denotes the low impedance transmission line of the impedance lower than 50Ω.

GND line 25B is formed on insulation layer 22A and insulation layer 22B is formed thereon. GND line 25A is formed on insulation layer 22B and insulation layer 22C is formed thereon. When viewed from above, GND line 25A does not overlap with GND line 25B.

Low impedance transmission line 24 is formed on insulation layer 22C and over GND line 25A. Further, 50Ω line is formed on insulation layer 22C and over GND line 25B.

The thickness of substrate between low impedance transmission line 24 and the GND line (a thickness of insulation layer 22C) is made thinner than the thickness of a substrate between 50Ω line 23 and the GND line (a thickness of insulation layer 22B+ insulation layer 22C). Thus, the line width of the low impedance transmission line can be made narrower than the case in which the thickness of the substrate is (22B+22C). As a result, the low impedance high efficiency amplifier can be reduced in size.

Eighth Embodiment

Figure 25:
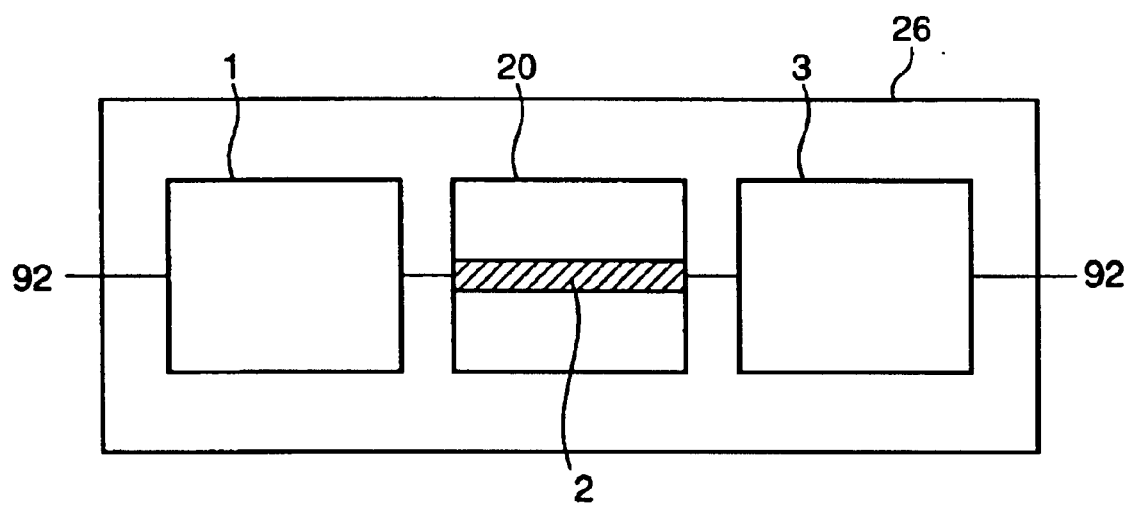
FIG. 25 is a top plan view referenced for conceptually describing a structure of a low impedance transmission line according to the eighth embodiment.

The eighth embodiment is intended to reduce the line width of the low impedance transmission line in the radio transmission unit. A structure according to the eighth embodiment will be described with reference to FIGS. 25 and 26. FIG. 25 is a top plan view referenced for conceptually describing the structure of the low impedance transmission line in the radio transmission unit substrate. With reference to FIG. 25, reference character 26 denotes a substrate on which the radio transmission unit (1100, 1200, . . . ) is formed, reference character 20 denotes a high-dielectric constant substrate to be formed on substrate 26, reference character 2 denotes the low impedance transmission line for connecting low impedance high efficiency amplifier 1 (1A, 1B, . . . ) and low impedance isolator 3 (3A, 3B, . . . ) formed on high-dielectric constant substrate 20. Here in the drawing, reference character "2" represents a portion of the low impedance transmission line and the low impedance transmission line is arranged in a direction 92—92 of substrate 26.

Figure 26:
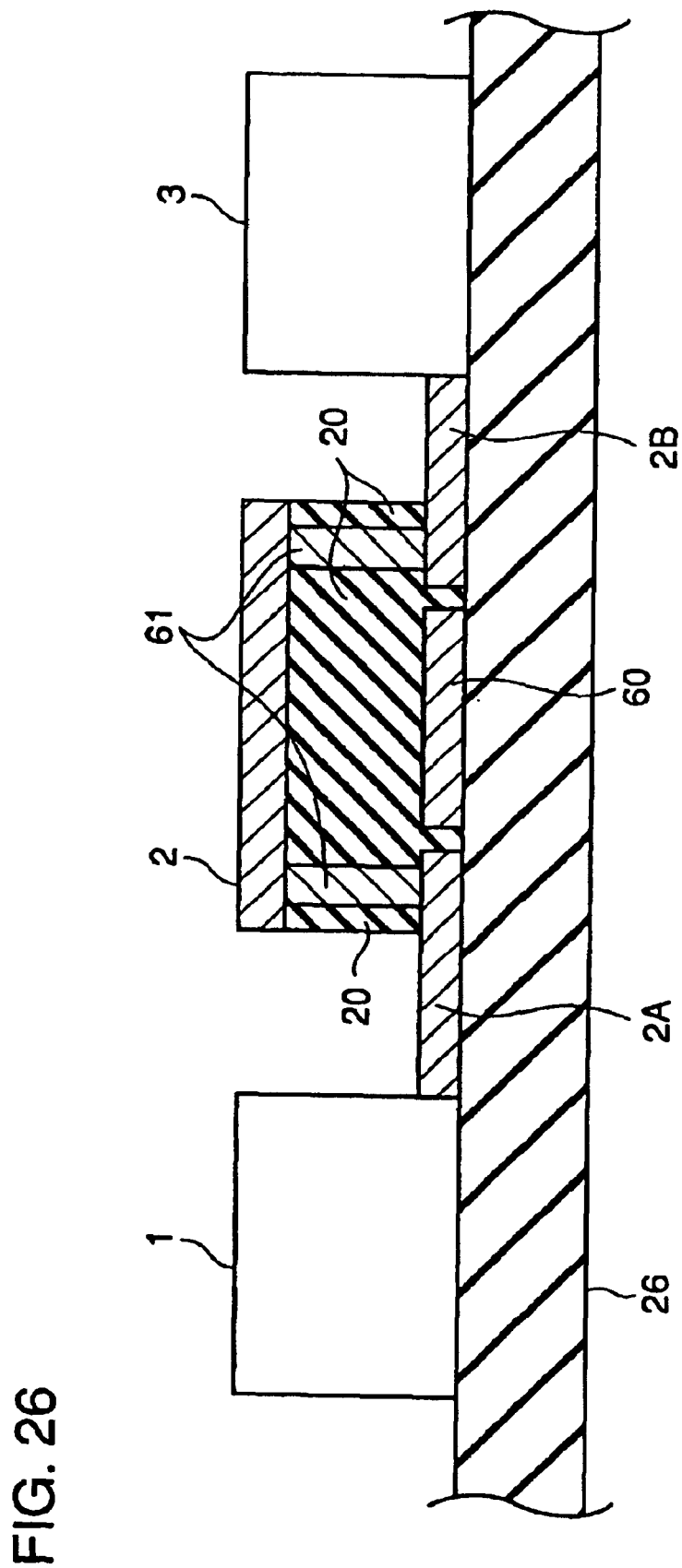
FIG. 26 is a diagram referenced for conceptually describing an example of a structure in a cross section of a low impedance transmission line according to the eighth embodiment.

FIG. 26 is a diagram referenced for describing a structure of the low impedance transmission line in a section when cut in a direction 92—92 in FIG. 25. In FIG. 26, reference characters 2A and 2B denote the low impedance transmission line, reference character 60 denotes a surface of the ground potential (GND surface) and reference character 61 denotes a via contact. Circuits 1 and 3 are not shown in the section.

Here, GND surface 60 is formed on substrate 26. Low impedance transmission lines 2A and 2B are formed on substrate 26 at certain interval such that they sandwich GND surface 60. High-dielectric constant substrate 20 is applied over GND surface 60 and low impedance transmission lines 2A and 2B such that it covers GND surface 60 and end portions of low impedance transmission lines 2A and 2B. Low impedance transmission line 2 is formed on high-dielectric constant substrate 20. Low impedance transmission line 2 and low impedance transmission lines 2A and 2B are electrically connected via via contact 61. A signal passes through low impedance high efficiency amplifier 1 to low impedance transmission lines 2A, 2 and 2B and reaches low impedance isolator 3.

High-dielectric constant substrate 20 is constituted of a material with higher dielectric constant than substrate 26.

When the low impedance high efficiency amplifier and the low impedance isolator according to the first embodiment are to be mounted on a mount board for devices such as portable remote terminal, transmission lines other than the transmission line between the low impedance high efficiency amplifier and the low impedance isolator are formed with a 50Ω (standard value) line.

Therefore, when the 50Ω line and the low impedance transmission line are formed on the same substrate, the line width of the low impedance transmission line becomes wider compared with that of the 50Ω line.

When the line width relative to the line length of the low impedance transmission line becomes too wide, the deviation from a simulation value at the time of design becomes large and makes the design difficult. When the low impedance transmission line is formed based on the 50Ω line, the size of the radio transmission unit will also be increased.

Hence, in the eighth embodiment, high-dielectric constant substrate 20 is arranged between the low impedance high efficiency amplifier and the low impedance isolator as described with reference to FIGS. 25 and 26. Thus, the low impedance transmission line having such line width as to facilitate the design thereof on high-dielectric constant substrate 20 can be arranged.

Figure 34:
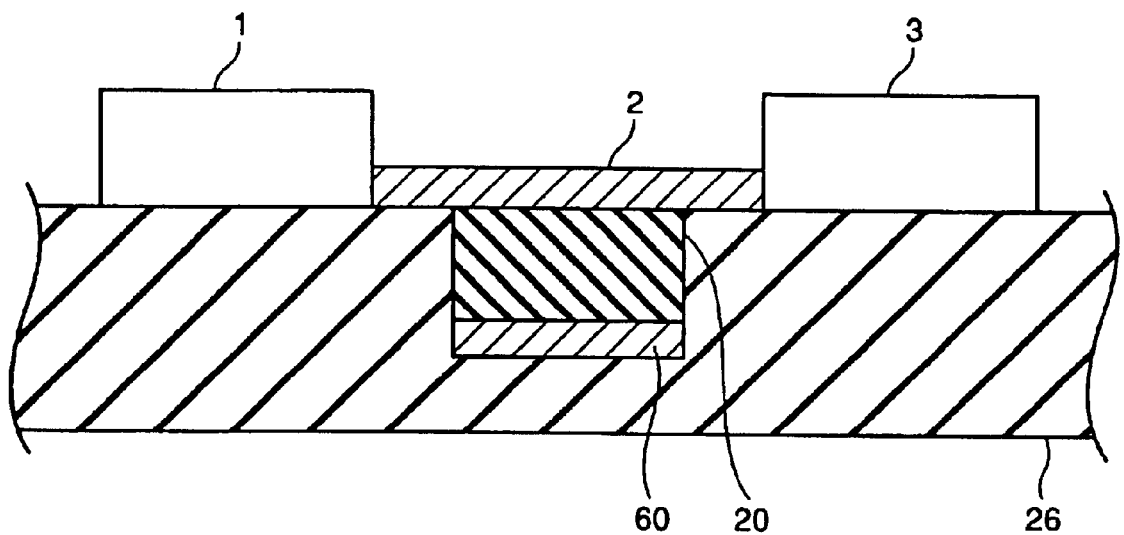
FIG. 34 is a diagram referenced for describing another example of a structure in cross section of a low impedance transmission line according to the eighth embodiment.
Figure 35:
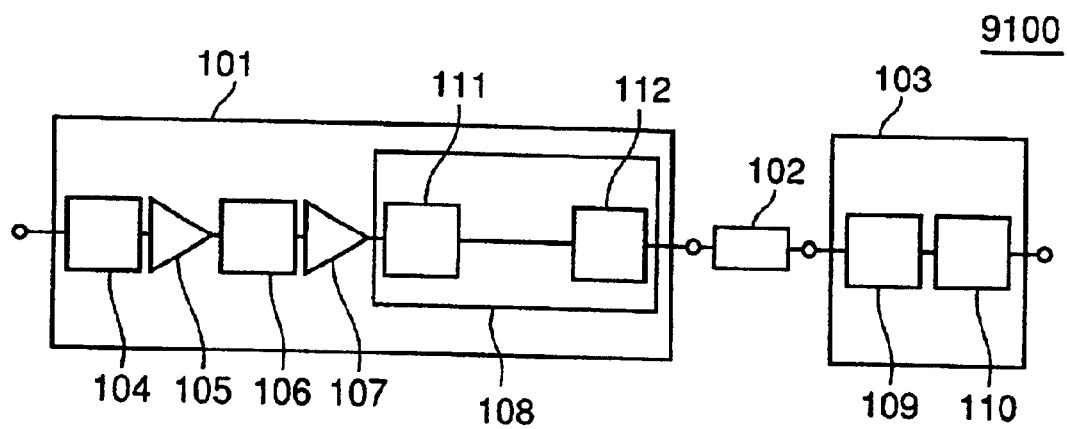
FIG. 35 is a diagram referenced for describing a structure of a main portion of a conventional radio transmission unit 9100.
Figure 36:
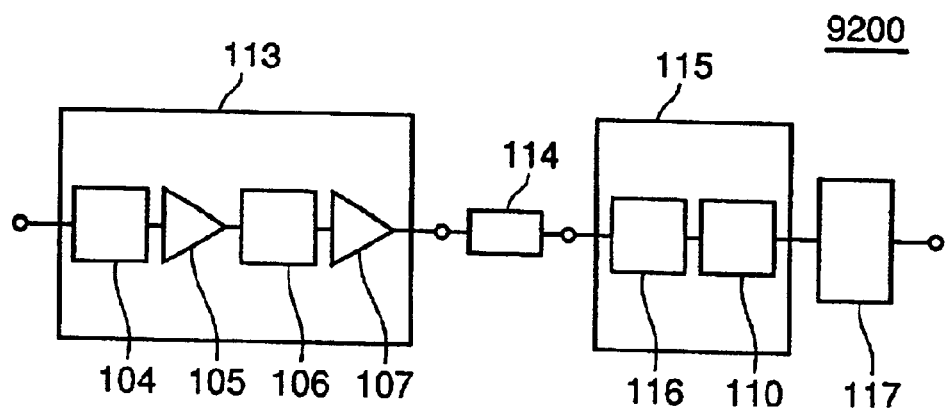
FIG. 36 is a diagram referenced for describing a structure of a main portion of a conventional radio transmission unit 9200.

Here, though a structure, in which high-dielectric constant substrate 20 is formed on substrate 26, has been described as an example, this is not a limiting example. As shown in FIG. 34, a structure can be adapted in which high-dielectric constant substrate 20 is buried in substrate 26 (low dielectric constant material). In this case, GND surface 60 is formed on a bottom surface of buried high-dielectric constant material 20 and low impedance transmission line 2 is formed on an upper surface of high-dielectric constant substrate 20.

Ninth Embodiment

Figure 27:
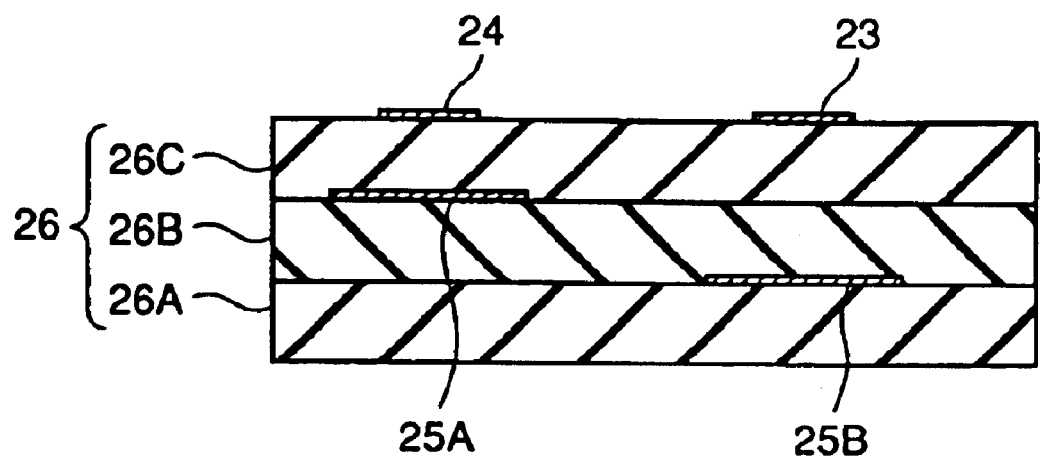
FIG. 27 is a diagram referenced for describing a structure of a low impedance transmission line in a radio transmission unit substrate according to the ninth embodiment.

The ninth embodiment is intended to reduce the line width of the low impedance transmission line as in the eighth embodiment. A structure according to the ninth embodiment will be described with reference to FIG. 27. FIG. 27 is a diagram referenced for describing a structure of the low impedance transmission line in a section in the radio transmission unit substrate. In the drawing, reference character 26 denotes a substrate on which the radio transmission unit (1100, 1200, . . . ) is formed constituted of three insulation layers 26A, 26B and 26C, reference characters 25A and 25B denote GND lines transmitting the ground potential, reference character 23 denotes a transmission line of 50Ω (50Ω line) and reference character 24 denotes the low impedance transmission line with a impedance lower than 50Ω.

GND line 25B is formed on insulation layer 26A and then insulation layer 26B is formed thereon. Further, GND line 25A is formed on insulation layer 26B and insulation layer 26C is formed thereon. When viewed from above, GND line 25A does not overlap with GND line 25B.

Low impedance transmission line 24 is formed on insulation layer 26C and over GND line 25A. Further, 50Ω line 23 is formed on insulation layer 26C and over GND line 25B.

The thickness of a substrate between low impedance transmission line 24 and the GND line (a thickness of insulation layer 26C) is made thinner than the thickness of a substrate between 50Ω line 23 and the GND line (a thickness of insulation layer 26B and insulation layer 26C). Then, the line width of the low impedance transmission line can be made narrower than the case in which the thickness of the substrate is made (26B+26C). As a result, the radio transmission unit can be reduced in size.

Tenth Embodiment

Figure 28:
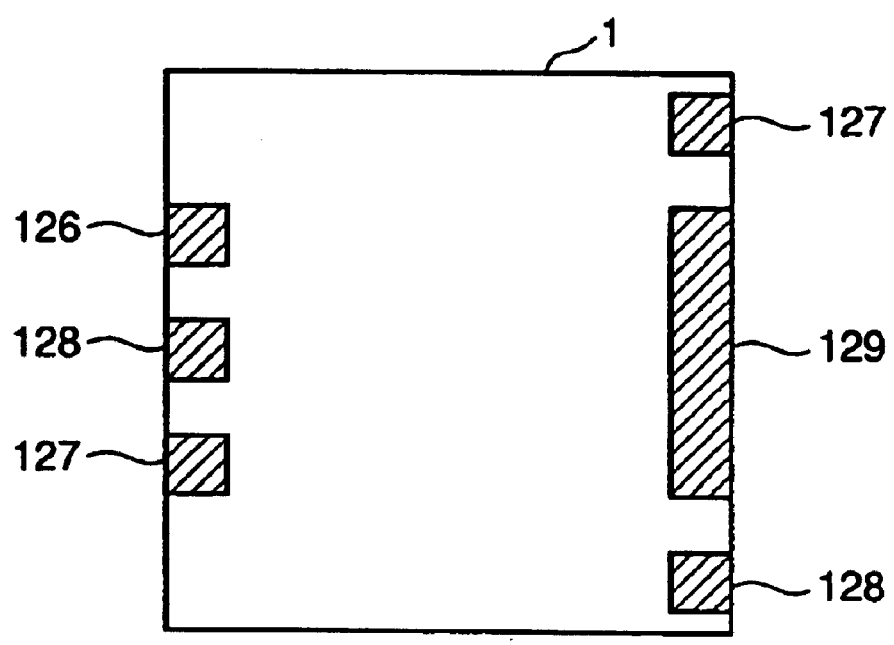
FIG. 28 is a diagram referenced for describing a structure of an input/output terminal according to the tenth embodiment.

The tenth embodiment relates to a structure of the input/output terminals of the low impedance high efficiency amplifier and the low impedance isolator described above. A structure of the input/output terminals of the low impedance high efficiency amplifier according to the tenth embodiment will be described with reference to FIG. 28. In FIG. 28, reference character 126 denotes an input terminal to receive a signal to be amplified, reference character 127 denotes a power supply terminal, reference character 128 denotes a ground (GND) terminal receiving a ground voltage, and reference character 129 denotes an output terminal to output an amplified signal. Terminals 126, 127 and 128 are substantially same in their size (width). The width of output terminal 129 is made wider than other terminals. With regard to the packaging of low impedance isolator 3, the width of the input/output terminals is adjusted based on the input/output impedance.

Figure 29:
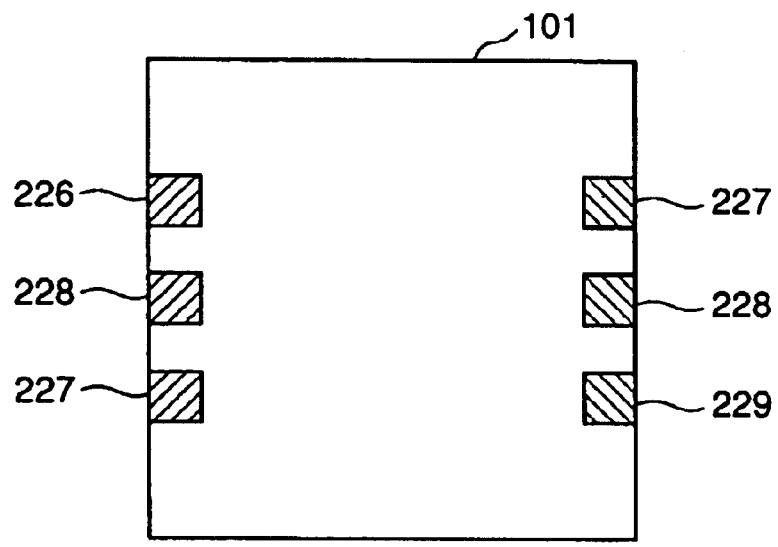
FIG. 29 is a diagram referenced for describing a structure of an input/output terminal in a conventional high efficiency amplifier.

For comparison, a structure of input/output terminals of a conventional high efficiency amplifier 101 will be described with reference to FIG. 29. In FIG. 29, reference character 226 denotes an input terminal to receive a signal to be amplified, reference character 227 denotes a power supply terminal, reference character 228 denotes a ground (GND) terminal to receive a ground voltage and reference character 229 denotes an output terminal to output an amplified signal. Terminals 226, 227, 228 and 229 are substantially same in their size (width). This is because the input impedance and the output impedance are both standardized to 50Ω. The same applies to the conventional isolator.

On the other hand, the output impedance of low impedance high efficiency amplifier 1 and the input impedance of low impedance isolator 3 described according to the first embodiment and so on are 3~30Ω. In addition, the input impedance of low impedance high efficiency amplifier 1 and the output impedance of low impedance isolator 3 are 50Ω. Hence, when the thickness of the substrate on which the radio transmission unit is formed and the dielectric constant are fixed, the line width will be changed according to the change in the characteristic impedance from 50Ω to 10Ω. Therefore, the width of the transmission line must be changed according to the impedance. For example, when the low impedance high efficiency amplifier is to be used, the output terminal is made wider than the input terminal. Then, the connection to a wider transmission line is made easier.

Eleventh Embodiment

Figure 30:
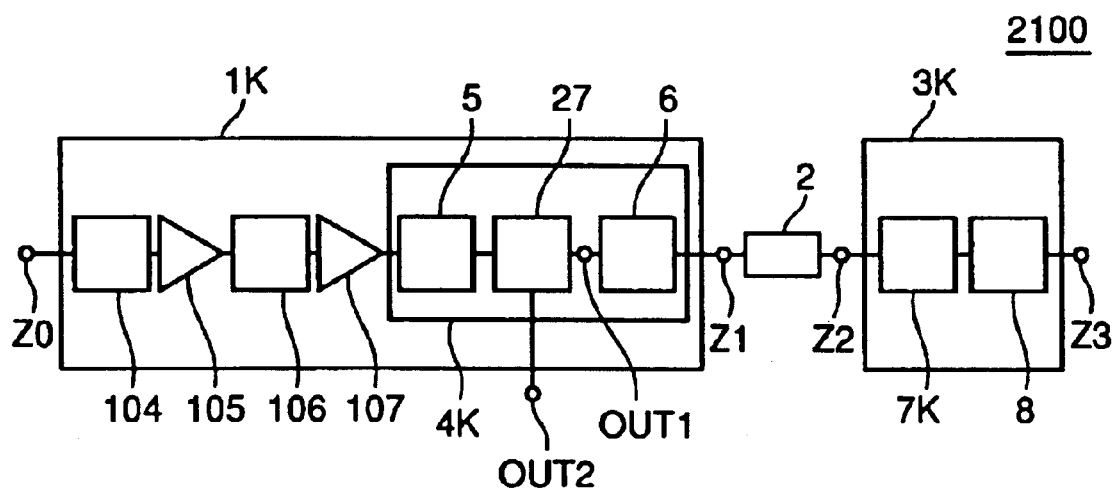
FIG. 30 is a diagram referenced for describing a main portion of a radio transmission unit 2100 according to the eleventh embodiment.

With reference to FIG. 30, the eleventh embodiment will be described. As described in FIG. 30, a radio transmission unit 2100 according to the eleventh embodiment includes a low impedance high efficiency amplifier 1K, low impedance transmission line 2 and a low impedance isolator 3.

Low impedance high efficiency amplifier 1K has an input impedance satisfying the standard value of 50Ω and an output impedance lower than the standard value 50Ω. Low impedance isolator 3K has an input impedance lower than the standard value of 50Ω and an output impedance satisfying the standard value 50Ω.

Low impedance isolator 3K includes an input matching circuit 7K and an isolator body 8. Input matching circuit 7K has the same structure as input matching circuits 7A, 7B, . . . .

Low impedance high efficiency amplifier 1K includes an input matching circuit 104, a first-stage amplifier 105, an interstage matching circuit 106, a second-stage amplifier 107 and an output matching circuit 4K. Output matching circuit 4K includes a harmonic processing circuit 5, a coupled circuit 27 and a fundamental wave regulator circuit 6.

Coupled circuit 27 has an input terminal to receive power, a first output terminal OUT1 to output power of the approximately the same level with the power supplied to the input terminal and a second output terminal OUT2 to output a signal with a level different from the signal level at first output terminal OUT1. Power is output from second output terminal OUT2 by an amount of a predetermined ratio (small value) of the output from first output terminal OUT1.

The eleventh embodiment is characterized in that the coupled circuit is provided between the harmonic processing circuit and the output in the low impedance high efficiency amplifier. The harmonic processing circuit is connected with the input terminal of the coupled circuit and the input of the fundamental wave regulator circuit is connected to first output terminal OUT1 of the coupled circuit. Thus, power (of the value smaller than the value at first output terminal OUT1) corresponding to the output power of the high efficiency amplifier is supplied to second output terminal OUT2 of coupled circuit 27.

By connecting a device for measuring an amount of power at second output terminal OUT2, the output of the low impedance high efficiency amplifier can be monitored and calculated.

In the example described above, coupled circuit 27 is connected between harmonic processing circuit 5 and fundamental wave regulator circuit 6 in output matching circuit 4K. The connection point of coupled circuit 27 is not limited to that in this example and coupled circuit 27 may be connected at any point as far as it is between the output of the second-stage amplifier of the low impedance high efficiency amplifier and the isolator body of low impedance isolator 3K.

Twelfth Embodiment

Figure 31:
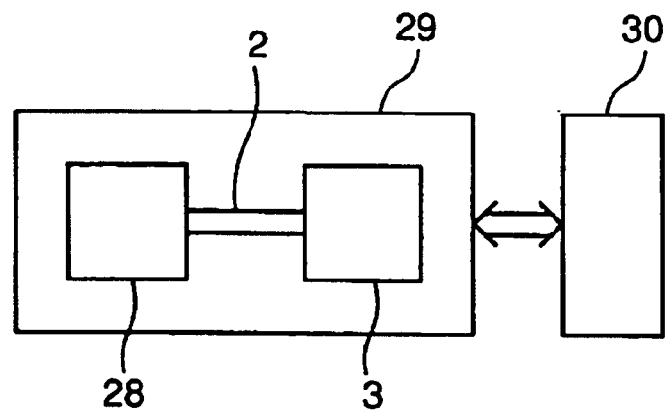
FIG. 31 is a diagram referenced for describing an approach to evaluate a low impedance high efficiency amplifier according to the twelfth embodiment.

With reference to FIG. 31, the twelfth embodiment will be described. In FIG. 31, reference character 29 denotes a board, reference character 28 denotes a socket for measurement of the high efficiency amplifier, and reference character 30 denotes a high frequency measuring device. Low impedance high efficiency amplifiers 1A, 1B, . . . as described above are mounted on the socket for the measurement of the high efficiency amplifier.

For the conventional high efficiency amplifier, the operation state can be measured by a common high frequency measuring device because the input impedance and the output impedance are both 50Ω.

On the other hand, for the evaluation of low impedance high efficiency amplifier 1 (1A, 1B, . . . ) described above, a measuring device for a low input impedance (3Ω~30Ω) is required. When the conventional high frequency measuring device is used for the evaluation of low impedance high efficiency amplifier 1, an impedance converter circuit for converting the impedance from 3Ω~30Ω to 50Ω is required because the input impedance of the conventional high frequency measuring device is set at 50Ω.

However, because the performance of the high efficiency amplifier largely varies according to the load impedance, the measured value can be varied according to a small variation of the impedance converter circuit. In addition, due to the technical and cost limitations, it is difficult to prepare an impedance converter circuit having a precise function.

Hence in the twelfth embodiment, low impedance isolator 3 is used as an impedance converter circuit to be connected between high frequency measuring device 30 for a 50Ω device and the low impedance high efficiency amplifier. A signal is supplied to the low impedance high efficiency amplifier mounted on a socket 28 for the measurement of the high efficiency amplifier and the output of low impedance isolator 3 is measured by high frequency measuring device 30.

In this case, the input impedance of high frequency measuring device 30 viewed from the high efficiency amplifier is in a very close state to the state in which the high efficiency amplifier is actually mounted on a mount board of a portable remote terminal to be used. Hence, difference between the measured value and the value obtained in the actual use will be reduced. Therefore, the low impedance high efficiency amplifier can be evaluated in a very close state to the mounted state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high efficiency amplifier, connected to a non-reciprocal circuit element having an input impedance lower than a standard impedance and an output impedance substantially equal to said standard impedance, comprising:

an input terminal to receive an input signal;

an output terminal connected to said non-reciprocal circuit element;

an amplifier element to amplify said input signal; and one or a plurality of harmonic processing circuits arranged between said amplifier element and said output terminal to process a harmonic in an output signal of said amplifier element.

2. The high efficiency amplifier according to claim 1, wherein
said standard impedance is 50 ohm and
an output impedance at said output terminal is substantially in the range from 3 ohm to 30 ohm.

3. The high efficiency amplifier according to claim 2, wherein
at least one of said one or plurality of harmonic processing circuits matches impedance of said harmonic.

4. The high efficiency amplifier according to claim 2, wherein
at least one of said one or plurality of harmonic processing circuits suppresses harmonic-related power leakage caused by said harmonic.

5. The high efficiency amplifier according to claim 2, wherein
at least one of said one or plurality of harmonic processing circuits serves as an open circuit load to said harmonic.

6. The high efficiency amplifier according to claim 2, wherein
at least one of said one or plurality of harmonic processing circuits serves as a short circuit load to said harmonic.

7. The high efficiency aplifier according to claim 1, wherein resonance frequency of said plurality of harmonic processing circuits are different from each other.

8. The high efficiency amplifier according to claim 1, further comprising
a fundamental wave regulator circuit between said amplifier element and said output terminal to perform a fine adjustment of an impedance of a fundamental wave in an output signal of said amplifier element.

9. The high efficiency amplifier according to claim 1, wherein said harmonic processing circuit is constituted of a capacitance element and a parasitic inductor coupled to said capacitance element.

10. The high efficiency amplifier according to claim 9, wherein said capacitance element is a chip capacitor.

11. The high efficiency amplifier according to claim 9, wherein said parasitic inductor is a microstrip line.

12. The high efficiency amplifier according to claim 1, further comprising
a coupled circuit arranged between said amplifier element and said output termina, and
said coupled circuit includes
a first output terminal to output power of an amount corresponding to an input power to said output terminal side, and
a second output terminal to output power of an amount corresponding to a predetermined ratio of power output from said first output terminal.

13. The high efficiency amplifier according to claim 1, further comprising
an output matching circuit is constituted only of
a signal line to transmit a signal, a bias circuit to supply a bias voltage to said amplifier element, and one or a plurality of elements connected in parallel to said signal line and having said one or plurality of harmonic processing circuits.

14. The high efficiency amplifier according to claim 1, further comprising an output matching circuit including said one or plurality of harmonic processing circuits to match an impedance of an output signal of said amplifier element and said output matching circuit is constituted only of
a signal line to transmit a signal, a bias circuit to supply bias voltage to said amplifier element, one or plurality of first elements connected in parallel to said signal line and including said one or plurality of harmonic processing circuits, and one or plurality of second elements other than a capacitance, said second elements being connected in series with said signal line.

15. A radio transmission device, comprising:
a high efficiency amplifier having an output impedance lower than a standard impedance;
a non-reciprocal circuit element having an input impedance lower than said standard impedance and an output impedance substantially equal to said standard impedance and
a transmission line to connect said high efficiency amplifier and said non-reciprocal circuit element;
said high efficiency amplifier including
an input terminal to receive an input signal,
an output terminal connected to said non-reciprocal circuit element via said transmission line,
an amplifier element to amplify said input signal, and
one or a plurality of harmonic processing circuits arranged between said amplifier element and said output terminal to process a harmonic in an output signal of said amplifier element.

16. The radio transmission device according to claim 15, wherein
said standard impedance is 50 ohm and
an output impedance in said high efficiency amplifier is substantially in the range from 3 ohm to 30 ohm.

17. The radio transmission device according to claim 16, wherein
at least one of said one or plurality of harmonic processing circuits matches impedance of said harmonic.

18. The radio transmission device according to claim 16, wherein
at least one of said one or plurality of harmonic processing circuits suppresses harmonic-related power leakage caused by said harmonic.

19. The radio transmission device according to claim 16, wherein
at least one of said one or plurality of harmonic processing circuits serves as an open circuit load to said harmonic.

20. The radio transmission device according to claim 16, wherein
at least one of said one or plurality of harmonic processing circuits serves as a short circuit load to said harmonic.

21. The radio transmission device according to clim 15, wherein resonance frequency of said plurality of harmonic processing circuits are different from each other.

22. The radio transmission device according to claim 15, wherein said high efficiency amplifier further includes,
a fundamental wave regulator circuit between said amplifier element and said output terminal to perform a fine adjustment of an impedance of a fundamental wave in an output signal of said amplifier element.

23. The radio transmission device according to claim 15, wherein said harmonic processing circuit is constituted of a capacitance element and parasitic inductor coupled to said capacitance element.

24. The radio transmission device according to claim 23, wherein said capacitance element is a chip capacitor.

25. The radio transmission device according to claim 23, wherein said parasitic inductor is a microstrip line.

26. The radio transmission device according to claim 15, wherein said high efficiency amplifier further includes, a coupled circuit, arranged between said amplifier element and said output terminal, including a first output terminal to output power of an amount corresponding to an input power to said output terminal side, and a second output terminal to output power of an amount corresponding to a predetermined ratio of power output from said first output terminal.

* * * * *